(12) United States Patent
Takeshita et al.

(10) Patent No.: US 6,529,281 B2
(45) Date of Patent: Mar. 4, 2003

(54) POSITION SENSITIVE DETECTORS AND DISTANCE MEASURING APPARATUS USING THEM

(75) Inventors: Tatsuo Takeshita, Hamamatsu (JP); Masayuki Sakakibara, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 09/891,351

(22) Filed: Jun. 27, 2001

(65) Prior Publication Data

US 2001/0043337 A1 Nov. 22, 2001

Related U.S. Application Data

(63) Continuation-in-part of application No. PCT/JP99/06756, filed on Dec. 2, 1999.

(30) Foreign Application Priority Data

Dec. 28, 1998 (JP) ............................................ 10-373600

(51) Int. Cl.$^7$ ............................ G01B 11/14; H01L 31/00
(52) U.S. Cl. .................... 356/614; 356/622; 250/214.1; 250/214 LA; 250/214 P
(58) Field of Search ................................. 356/614, 622, 356/3.04, 3.06, 3.08, 3.1, 3.13; 250/214 P, 214 LA, 214 PR, 214.1; 257/21, 184, 290, 457, 482

(56) References Cited

U.S. PATENT DOCUMENTS

| | | | |
|---|---|---|---|
| 4,441,810 A | | 4/1984 | Momose et al. ................. 356/1 |
| 5,315,104 A | * | 5/1994 | Plumb ....................... 250/214.1 |
| 5,596,186 A | * | 1/1997 | Kobayashi ................. 250/214.1 |
| 5,703,357 A | * | 12/1997 | Shih et al. ............. 250/214 PR |

FOREIGN PATENT DOCUMENTS

| | | | |
|---|---|---|---|
| JP | 59-17288 | | 1/1984 |
| JP | 01 115 170 | * | 5/1989 |
| JP | 04 240 511 | * | 8/1992 |
| JP | 4-313279 | | 11/1992 |
| JP | 05 005 619 | * | 1/1993 |
| JP | 05 005 620 | * | 1/1993 |
| JP | 5-79818 | | 3/1993 |
| JP | 5-164552 | | 6/1993 |
| JP | 6-112520 | | 4/1994 |
| JP | 06 140 665 | * | 5/1994 |
| JP | 6-105163 | | 12/1994 |

* cited by examiner

Primary Examiner—Frank G. Font
Assistant Examiner—Sang H. Nguyen
(74) Attorney, Agent, or Firm—Morgan, Lewis & Bockius LLP

(57) ABSTRACT

In an apparatus a photosensitve surface of PSD is provided with a conductive trunk region extending in a base line direction and a plurality of conductive branch regions arranged in the base line direction and each connected to the trunk region, and each branch region makes an angle of 45° to the base line direction. An LED is arranged to be able to project slit light extending at the angle of 45° to the base line direction.

23 Claims, 25 Drawing Sheets

P — 500 μm / 200 μm

M

M

IL

IL, 26', 24'

POSITION SENSITIVE DETECTORS AND DISTANCE MEASURING APPARATUS USING THEM

RELATED APPLICATION

This is a continuation-in-part application of application Ser. No. PCT/JP99/06756 filed on Dec. 2, 1999, now pending.

BACKGROUND OF THE INVENTION

1. Field of the Invention

The present invention relates to position sensitive detectors and distance measuring apparatus using them.

2. Related Background Art

As distance measuring apparatus for measuring a distance to a measured object, there are well-known distance measuring apparatus provided with a light source and a position sensitive detector. Such distance measuring apparatus are constructed on the basis of the triangulation principle and arranged to measure the distance to the measured object, based on a position where light having been projected from the light source and then reflected at the measured object is incident to a photosensitve surface of the position sensitive detector. Specifically, the position where the light is incident to the photosensitve surface of the position sensitive detector varies in a base line direction according to the distance to the measured object. Accordingly, the distance to the measured object can be measured by detecting the incidence position of the light on the photosensitve surface.

A well-known position sensitive detector used in the above distance measuring apparatus is constructed in such structure that a pair of signal extracting electrodes are provided at two ends of a conductive trunk region extending in the base line direction, a plurality of conductive branch regions extending perpendicular to the trunk region (or the base line direction) are arranged in the base line direction, and each of the branch regions is electrically connected to the trunk region. In the position sensitive detector of this structure, charges (carriers) generated with incidence of light flow into the neighboring branch regions and then propagate in the direction perpendicular to the base line direction in the branch regions to flow into the trunk region. After that, the charges are split there in inverse proportion to resistances from the inflow position to the both ends of the trunk region and the charges thus split propagate in the trunk region to be outputted from the respective signal extracting electrodes. Therefore, the incidence position of light on the photosensitve surface can be detected by comparing output currents from the two signal extracting electrodes.

SUMMARY OF THE INVENTION

The above distance measuring apparatus, however, had the following problem. Specifically, in the case of the distance measuring apparatus constructed to project the light from the light source to the measured object and detect the reflected light from the measured object, there can occur such a phenomenon that part of the light projected from the light source deviates from the measured object (which will be referred to hereinafter as spot chipping). With the spot chipping, the position sensitive detector can detect the reflected light of only part of the light projected from the light source and can cause a measurement error of the distance to the measured object in certain cases.

Particularly, since the incidence position of the light onto the photosensitve surface of the position sensitive detector varies according to the distance to the measured object in the base line direction, the measurement error will be large if the spot chipping occurs in the base line direction. Namely, in use of the above conventional position sensitive detector, the carriers generated with incidence of light propagate in the direction perpendicular to the base line direction in the branch regions to flow into the trunk region, and thus a deviation of the center of gravity in the base line direction of the incident light due to the spot chipping leads to a measurement error as it is.

In contrast with it, for example, the distance measuring apparatus disclosed in Japanese Patent Application Laid-Open No. H05-164552 is arranged to project spot light of asymmetric shape with respect to the base line direction and receive the spot light by triple photodetective elements, thereby correcting the measurement error due to the spot chipping.

Such distance measuring apparatus, however, needs to use the light emitting device for projecting the spot light of asymmetric shape and the triple light receiving elements and each of the elements or the distance measuring apparatus itself becomes complicated and large in scale and is difficult to make up at low cost. An object of the present invention is to provide distance measuring apparatus with a reduced measurement error and position sensitive detectors used therein.

A position sensitive detector according to the present invention is a position sensitive detector in which currents outputted from two ends of a conductive trunk region vary according to a position of incidence of light on a photosensitve surface comprising a plurality of conductive branch regions extending from the trunk region, wherein the branch regions extend substantially obliquely relative to a position detection direction. When the detector is incorporated in the distance measuring apparatus, the position detection direction is coincident with the base line direction. A minimum of an angle between the extending direction of the branch regions and the position detection direction is preferably not more than 85°, more preferably not less than 30°, and still more preferably approximately 45°. The term "approximately" herein means variation of less than ±5%. Each of the branch regions preferably has a substantially equal width along the extending direction, the extending direction of each of the branch regions is preferably constant in the photosensitve surface, and it is preferable that a luminous shape of the incident light to the position sensitive detector be a rectangle and that the longitudinal direction of the rectangle be coincident with the extending direction of the branch regions. This incident light preferably has a size enough to simultaneously overlap with a plurality of branch regions. It is preferable that a pair of signal extracting electrodes be provided at two ends of the trunk region and that each of the pair of signal extracting electrodes be of a nearly triangular shape.

Since the above position sensitive detector reduces the possibility of causing the measurement error due to the spot chipping, a distance measuring apparatus with high accuracy and with a reduced measurement error can be provided when the detector is incorporated therein.

DESCRIPTION OF THE PREFERRED EMBODIMENT

The distance measuring apparatus according to the embodiments of the present invention will be described with reference to the drawings. The position sensitive detector of the present invention is incorporated in the distance measuring apparatus according to the present embodiment.

Figure 1:
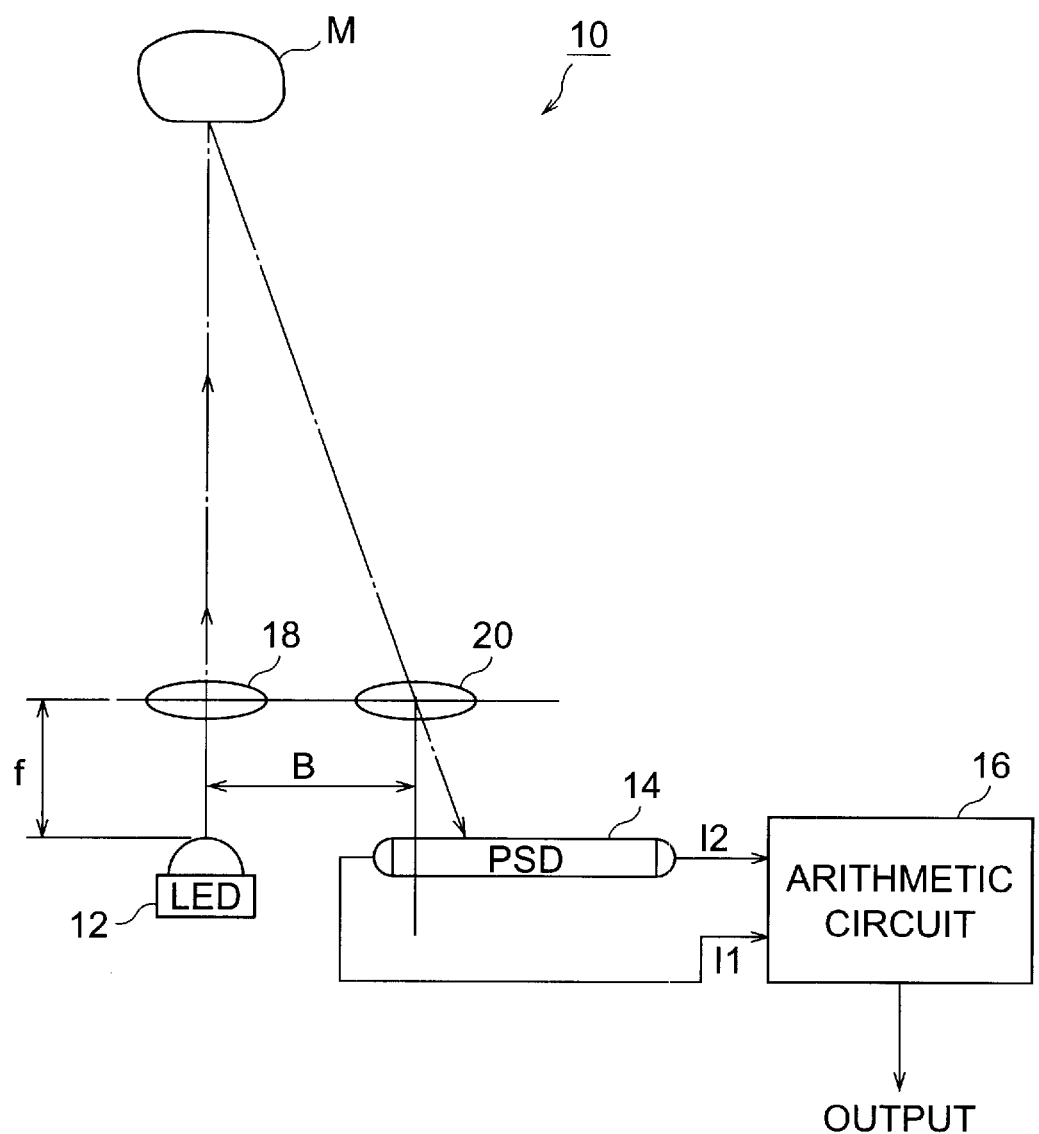
FIG. 1 is a block diagram of a distance measuring apparatus.

First, the structure of the distance measuring apparatus according to the present embodiment will be described. FIG. 1 is a diagram to show the structure of the distance measuring apparatus according to the present embodiment and FIG. 2 a perspective view of the distance measuring apparatus according to the present embodiment.

The distance measuring apparatus 10 according to the present embodiment is constructed, as illustrated in FIG. 1, of a light emitting diode (hereinafter referred to as LED 12) being a light source for projecting light to a measured object M, a position sensitive detector (hereinafter referred to as PSD 14) for outputting a signal according to an incidence position of the light projected from the LED 12 and reflected from the measured object M, an arithmetic means 16 for computing a distance to the measured object M, based on the output of the PSD 14, and lenses 18, 20 opposed to a light projecting surface of the LED 12 and to a photosensitve surface of the PSD 14, respectively. Each of the components will be described hereinafter in detail.

Figure 3:
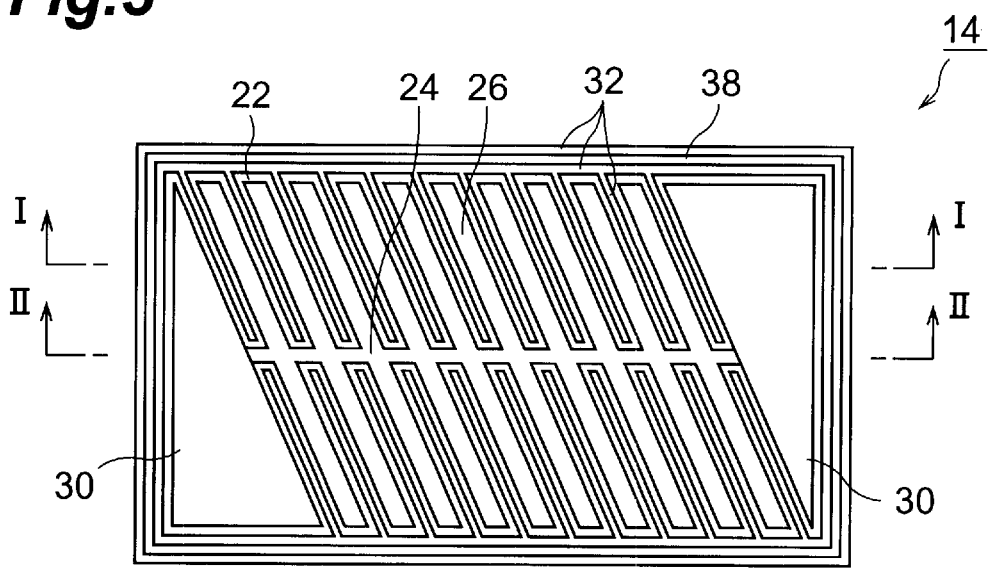
FIG. 3 is a plan view of a PSD.
Figure 4:
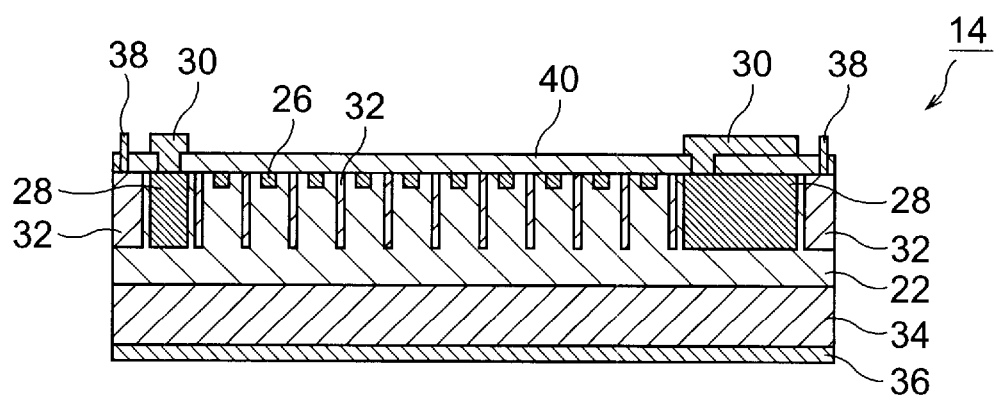
FIG. 4 is a cross-sectional view along line I—I of FIG. 3.
Figure 5:
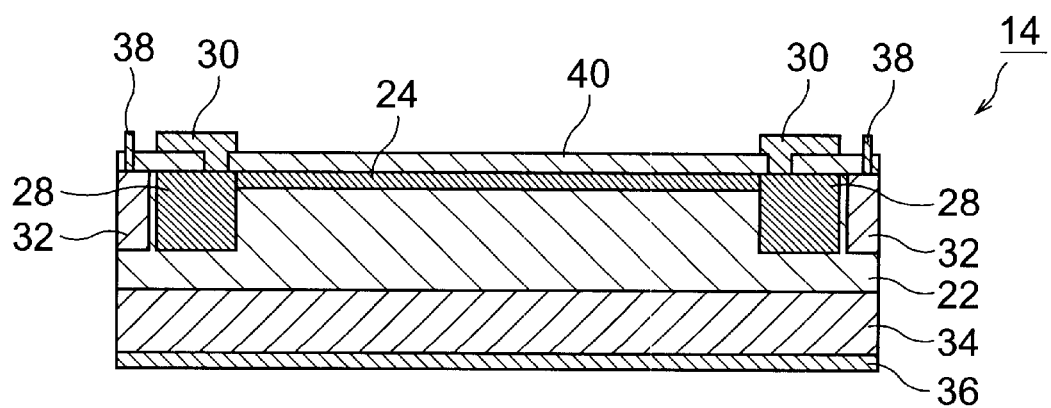
FIG. 5 is a cross-sectional view along line II—II of FIG. 3.

FIG. 3 is a plan view of the PSD 14 (from which a passivation film described hereinafter is omitted), FIG. 4 a cross-sectional view along line I—I of FIG. 3, and FIG. 5 a cross-sectional view along line II—II of FIG. 3. The shape of the PSD on the plan view is a rectangle, the longitudinal direction of the rectangle is defined as a base line direction, and this base line direction is coincident with the position detection direction in the device.

The PSD 14 is constructed in such structure that an electroconductive trunk region (p-type layer) 24 of p-type (second conduction type) Si and a plurality of electroconductive branch regions (p-type layer) 26 of the same p-type Si are formed in approximately equal depth on the front surface side of a semiconductor substrate 22 of n-type (first conduction type) Si, and the front surface acts as a photosensitve surface of the PSD 14. Here the surface of PSD 14 is a rectangle and the detection of the incidence position of light is carried out while the direction parallel to the long sides of the rectangle is defined as the base line direction (the direction in which change in the incidence position of light is detected).

The trunk region 24 is formed to extend in the long-side direction, i.e., in the base line direction and in the approximately central part of the short-side direction of the rectangle. A plurality of branch regions 26 each having an approximately equal length are arranged in the base line direction and each of them is electrically connected in the approximately central part thereof to the trunk region 24. Particularly, the angle between the extending direction of the branch regions 26 and the base line direction is 45° (an acute angle) and the branch regions 26 are arranged approximately in parallel to each other.

At the both ends of the trunk region 24, a pair of high-concentration region (p-type layer) 28 of p-type Si doped with a higher concentration of impurities than the trunk region 24, are formed in a greater depth than the trunk region 24, and a pair of signal extracting electrodes 30 of nearly triangular shape are provided in ohmic contact on the respective high-concentration regions 28.

High-concentration regions (n-type layer) 32 of n-type Si doped with a higher concentration of impurities than the semiconductor substrate 22 are formed in the peripheral part, in spaces between the branch regions 26, and in spaces between the branch regions 26 and the high-concentration regions 28 on the front surface side of the PSD 14. The high-concentration regions 32 are formed approximately in the same depth as the high-concentration regions 28, thereby assuring electric insulation between the branch regions 26 and electric insulation between the branch regions 26 and the high-concentration regions 28. Therefore, the high-concentration regions 32 prevent an electric current from flowing in the base line direction between the branch regions 26 and between the branch regions 26 and the high-concentration regions 28.

A high-concentration region 34 of n-type Si doped with a higher concentration of impurities than the semiconductor substrate 22 is formed on the back surface of PSD 14 and a back electrode 36 is provided in ohmic contact on the high-concentration region 34. Therefore, the PSD 14 can be operated by applying a predetermined voltage between the signal extracting electrodes 30 and the back electrode 36.

An outer electrode 38 is provided in ohmic contact with the high-concentration regions 32 in the peripheral part of the front surface of the PSD 14. The outer electrode 38 prevents light from entering the peripheral part of the photosensitve surface and the PSD 14 can also be operated by applying a predetermined voltage to between the outer electrode 38 and the signal extracting electrodes 30.

A passivation film 40 is formed to protect the front surface of PSD14 being the photosensitve surface, across the entire surface except for the portions where the signal extracting electrodes 30 and the outer electrode 38 are formed, in the front surface of the PSD14.

In the above structure, carriers are generated according to incidence of light in the PSD 14 when the light is incident to the photosensitve surface. The carriers are outputted as electric currents from the pair of signal extracting electrodes 30 provided at the both ends of the trunk region 24. On that occasion, the electric currents from the respective signal extracting electrodes 30 vary according to the incidence position of the light in the base line direction on the photosensitve surface, i.e., according to the distances between the incidence position of light and the respective signal extracting electrodes 30, and thus the incidence position of light can be detected based on the electric currents.

Figure 2:
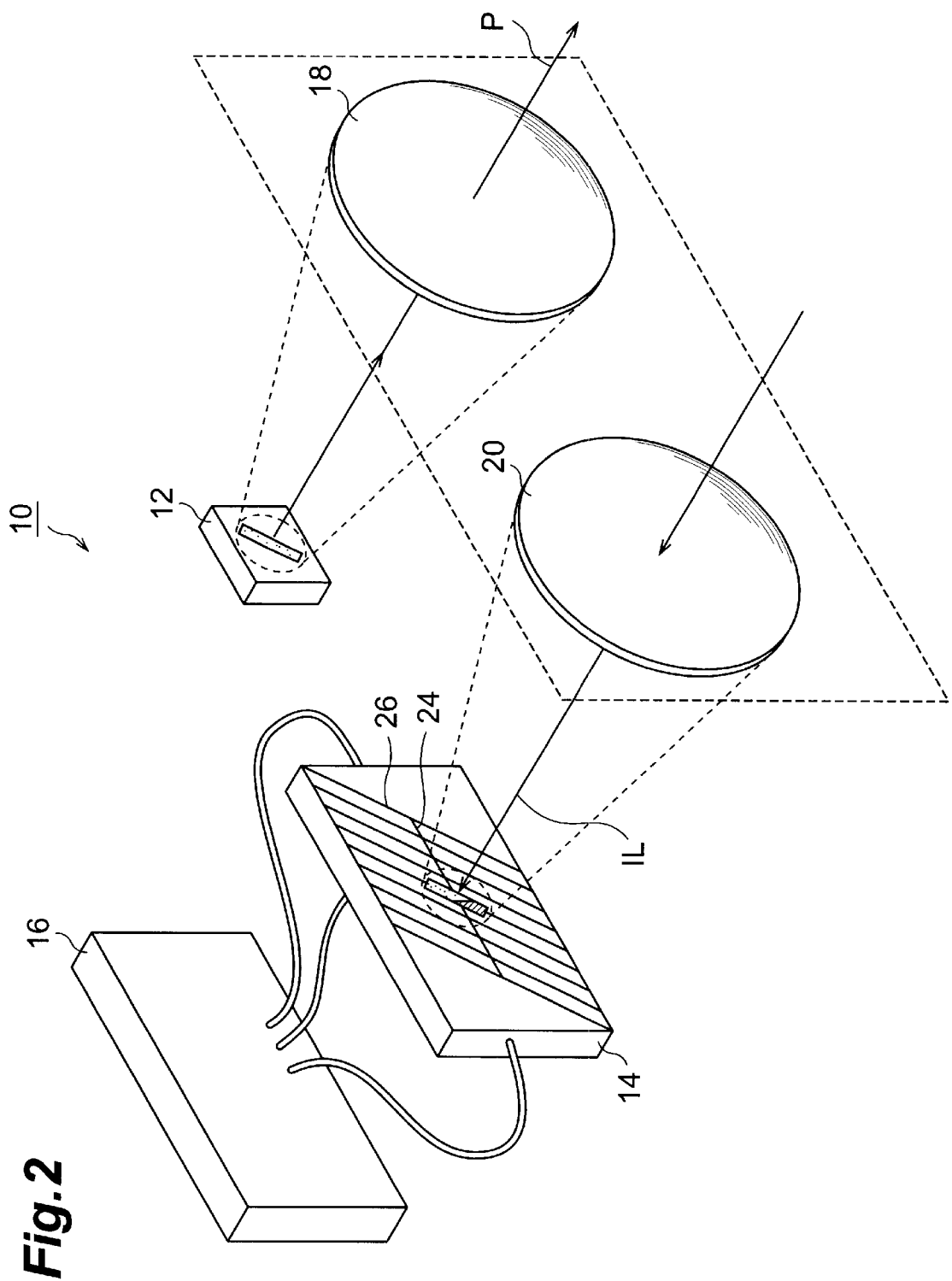
FIG. 2 is a perspective view of the distance measuring apparatus.

The LED 12, as illustrated in FIG. 1 or FIG. 2, is located with a predetermined spacing from the PSD 14 on the extension line of the base line direction of the PSD 14. Here the LED 12 is a light source capable of projecting slit light and is arranged so that the longitudinal direction of the cross section of the slit light has the angle of 45° to the base line direction. Therefore, the longitudinal direction of the cross section of the slit light that was reflected by the measured object M and that is incident to the photosensitve surface of the PSD 14, is approximately parallel to the extending direction of the branch regions 26 of the PSD 14.

The lens 18 is disposed at the position opposite to the light projecting surface of the LED 12. The distance between the light projecting surface of the LED 12 and the lens 18 is coincident with the focal length f of the lens 18, so that the slit light projected from the LED 12 is condensed by the lens 18 to be projected toward the measured object M.

The lens 20 is arranged opposite to the photosensitve surface of the PSD 14 and with a spacing B to the lens 18. The distance between the photosensitve surface of the PSD 14 and the lens 20 is also coincident with the focal length f of the lens 20, so that the reflected light by the measured object M is condensed by the lens 20 to impinge on the photosensitve surface of the PSD 14. Here the center line of the lens 20 is aligned with the LED-12-side end of the trunk region 24 formed on the photosensitve surface of the PSD 14.

Accordingly, the reflected light from the measured object M existing at infinity is incident to the LED-12-side end of the trunk region 24 of the PSD 14, and the incidence position of the reflected light moves away from the LED-12-side end of the trunk region 24 as the measured object M approaches the lens 18 (or the lens 20).

The arithmetic means 16 computes the distance to the measured object M, based on the output currents of PSD 14. Specifically, it accepts the current I1 outputted from one of the signal extracting electrodes 30 of the PSD 14 and the current I2 outputted from the other and computes the distance to the measured object M from the lens 18 (or the lens 20), based on the currents I1, I2. A detailed arithmetic method will be described hereinafter.

Figure 6:
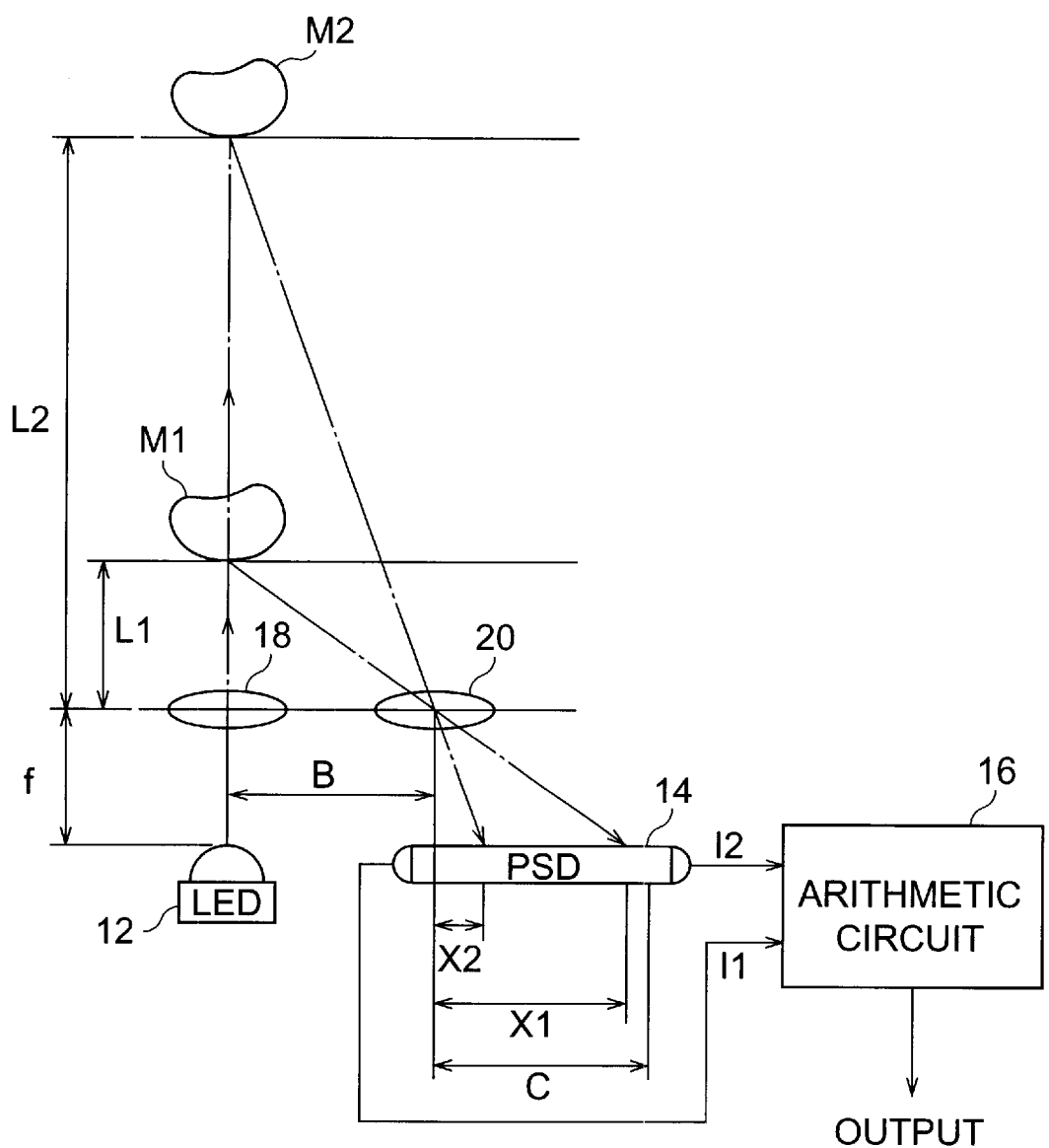
FIG. 6 is a diagram to show the principle of distance measurement.

In the next place, the action of the distance measuring apparatus according to the present embodiment will be described. First, the principle of distance measurement in the distance measuring apparatus 10 according to the present embodiment will be described. FIG. 6 is a diagram to show the principle of distance measurement in the distance measuring apparatus 10.

When light is incident to the photosensitve surface of the PSD 14, hole-electron pairs (charges) are generated according to the incident light inside the PSD 14 to diffuse. Either one of such hole-electron pairs (charges) flow into the neighboring branch regions 26 in accordance with the electric field inside the PSD 14, propagate in the branch regions 26, and then flow into the trunk region 24. The charges (carriers) flowing into the trunk region 24 propagate in the trunk region 24 and are taken out as the currents I1, I2 from the pair of respective signal extracting electrodes 30 provided at the two ends of the trunk region 24. Since the trunk region 24 has an electric resistance herein, the carriers generated with incidence of light are resistance-divided in inverse proportion to the distances between the flowing positions into the trunk region 24 and each signal extracting electrode 30 (more precisely, each end of the trunk region) to be outputted from each signal extracting electrode 30. Accordingly, under such notation that I1 denotes the current outputted from one (the LED 12 side) of the signal extracting electrodes 30, I2 the current outputted from the other, and C the length of the trunk region 24; the distance X from the LED-12-side end of the trunk region 24 to the incidence position of light is expressed by the following equation.

$$X = C \times I2/(I1+I2)$$

By applying the principle of triangulation, the distance L from the lens 18 (or the lens 20) to the measured object M is expressed by the following equation.

$$L = (fB)/X$$

In this equation, as described above, B represents the distance between the centers of the lens 18 and the lens 20, f the focal length of the lens 18 and the lens 20, and X the distance from the LED-12-side end of the trunk region 24 to the incidence position of light. Therefore, the distance L from the lens 18 (or the lens 20) to the measured object M is determined using the currents I1, I2 outputted from the respective signal extracting electrodes 30. Specifically, when the distance L (=L1) from the lens 18 to the measured object M (=M1) is short as illustrated in FIG. 6, the distance X (=X1) from the LED-12-side end of the trunk region 24 to the incidence position of light becomes long; when the distance L (=L2) from the lens 18 to the measured object M (=M2) is long, the distance X (=X2) from the LED-12-side end of the trunk region 24 to the incidence position of light becomes short.

In the next place, the state of distance measurement in the distance measuring apparatus 10 according to the present embodiment will be described in comparison with the state of distance measurement in the distance measuring apparatus according to the prior art, with occurrence of spot chipping.

Figure 7:
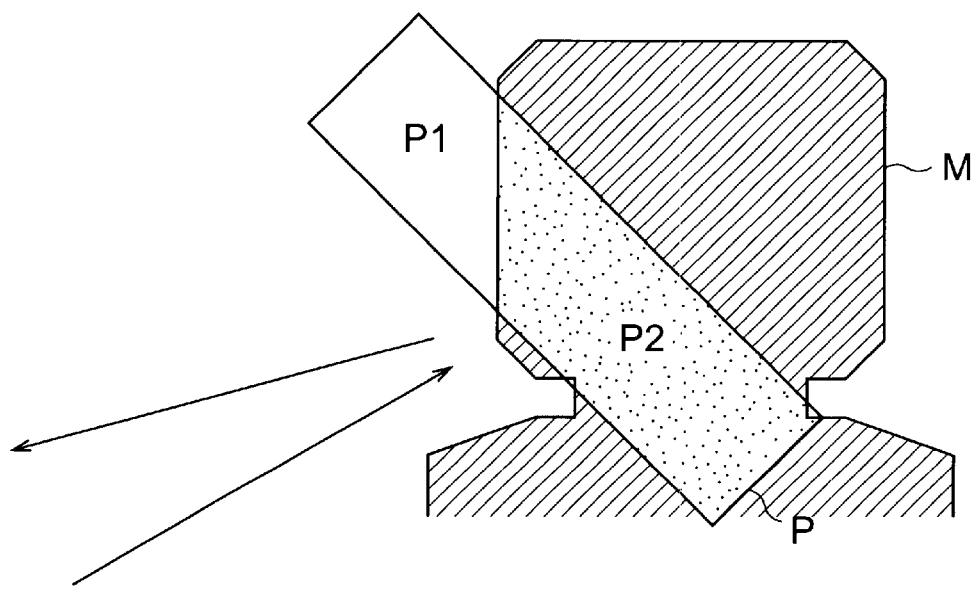
FIG. 7 is a diagram to show the spot chipping.

The spot chipping normally means such a phenomenon that part of the light projected from the light source deviates from the measured object, or the deviating part, in the distance measuring apparatus constructed to project the light from the light source toward the measured object and detect the reflected light from the measured object. Namely, as illustrated in FIG. 7, when the projected light P impinges upon the measured object M, the spot chipping is defined as the part (P1 of FIG. 7) deviating from the measured object M in the projected light P. In the following description, the spot chipping area (non-illuminating area) in the projected light P is denoted by P1, and the area under illumination (illuminating area) by P2.

With occurrence of the spot chipping, the position detector such as the PSD can detect the reflected light only part of the light projected from the light source and make a measurement error in the distance to the measured object in certain cases. Particularly, since the incidence position of light to the photosensitve surface of the position detector varies according to the distance to the measured object in the base line direction, the measurement error will be large if the spot chipping occurs in the base line direction.

Figure 8A:
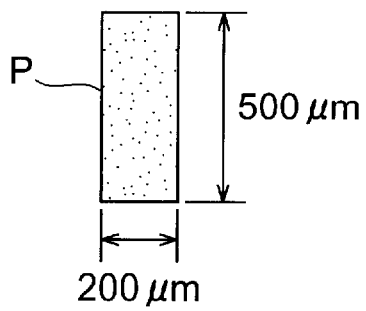
FIGS. 8A, 8B, 8C, 8D, and 8E are diagrams to show measurement conditions.
Figure 8B:
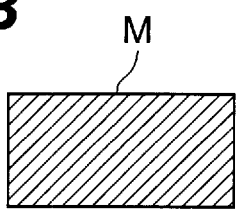
Figure 8C:
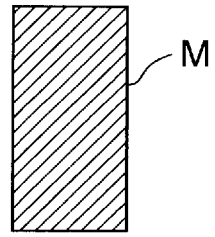
Figure 8D:
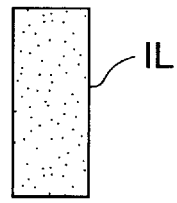
Figure 8E:
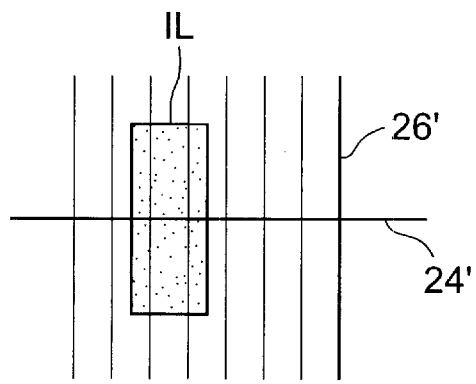

Now let us first describe how the distance is measured in the distance measuring apparatus according to the prior art. The distance measuring apparatus according to the prior art employs as a position detector the PSD in which the trunk region 24' extending in the base line direction and the branch regions 26' perpendicular thereto are formed in the photosensitve surface. The LED light emitted from the LED is the slit light 500 μm vertical and 200 μm horizontal as illustrated in FIG. 8A. The measured object is considered to be one of a horizontally long rectangle or a vertically long rectangle as illustrated in FIG. 8B or 8C. Without occurrence of the spot chipping, the LED light is reflected by the measured object and is incident to the PSD in the form of PSD incident light IL having the cross-sectional shape as illustrated in FIG. 8D. The positional relation among the trunk region 24', the branch regions 26', and the PSD incident light on that occasion is as illustrated in FIG. 8E.

Under the above measurement conditions, position detection errors in the PSD under various situations are presented in FIGS. 9A, 9B, 9C, and 9D. In the drawings the symbol R represents the detection position without occurrence of the spot chipping, the symbol S the detection position with occurrence of the spot chipping, and Δ the position detection error with occurrence of the spot chipping. A hatched portion indicates the area of the reflected light when the whole of the measured object M is illuminated and a dotted portion the LED light P. Then the light in an overlapping area between the hatched portion and the dotted portion is incident to the PSD. Further, BL represents the base line direction. Projections of the measured object M and projected light P on the photosensitve surface of the PSD are illustrated together with the base line direction BL. The shape of the incident light IL is the shape of the overlapping area between the measured object M and the projected light P, i.e., the illuminating area P2.

Figure 9A:
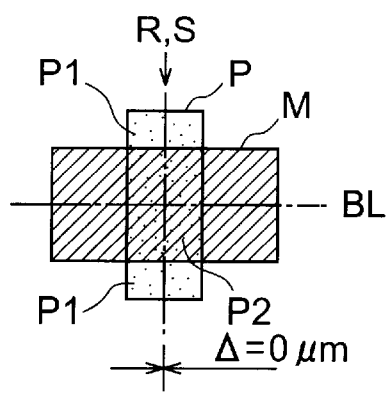
FIGS. 9A, 9B, 9C, and 9D are diagrams to show measurement results.
Figure 9B:
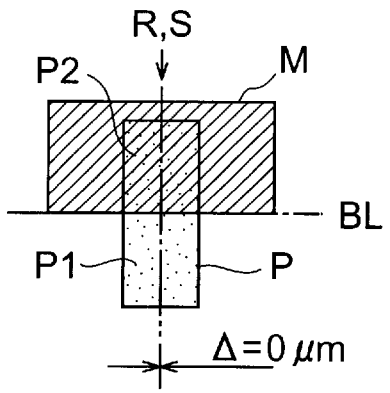
Figure 9C:
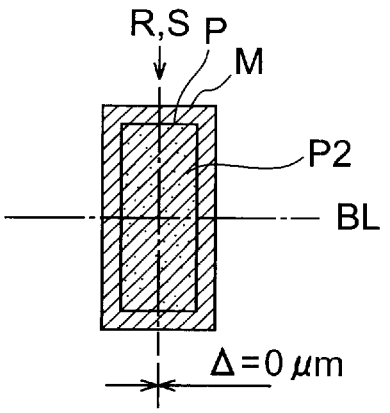
Figure 9D:
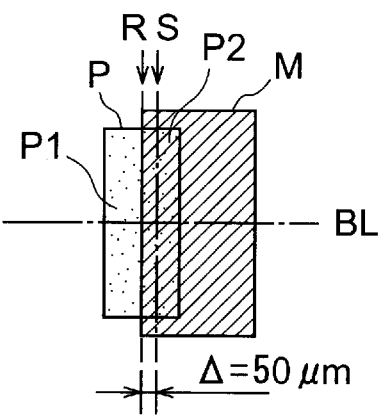

As illustrated in FIG. 9A, when the spot chipping appears symmetric up and down, i.e., at the ends in the direction perpendicular to the base line direction, the spot chipping does not affect the position detection in the base line direction, so that the position detection error is 0. As illustrated in FIG. 9B, when the spot chipping appears asymmetric in the vertical direction, the spot chipping does not affect the position detection in the base line direction, either, and the position detection error is 0. Further, when there appears no spot chipping as illustrated in FIG. 9C, the position detection error is 0, of course. In contrast with it, as illustrated in FIG. 9D, when the spot chipping appears asymmetric in the horizontal direction, i.e., in the base line direction, no carriers flow into the branch regions corresponding to the part of the spot chipping at all and the number of branch regions 26 with flow of carriers is extremely decreased as compared with the case without the spot chipping. As a consequence, there appears deviation of the position of the center of gravity and a large position detection error is made (50 μm in the case of FIG. 9D). In this case, the position detection error of 50 μm in the PSD amounts to 5% where the length C of the trunk region of the PSD is equal to 1000 μm.

Figure 10A:
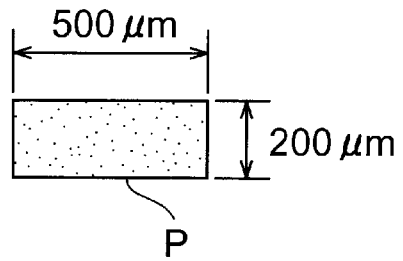
FIGS. 10A, 10B, 10C, 10D, and 10E are diagrams to show measurement conditions.
Figure 10B:
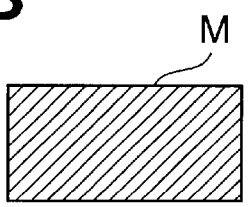
Figure 10C:
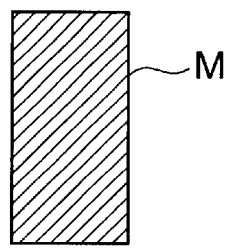
Figure 10D:
Figure 10E:
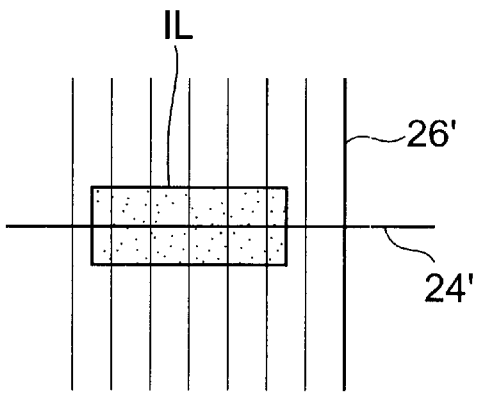

FIGS. 11A, 11B, 11C, and 11D show position detection errors in the PSD where the LED light from the LED is the slit light 200 μm vertical and 500 μm horizontal as illustrated in FIG. 10A. The measured object is considered to be the measured object M of the horizontally long or vertically long rectangle as illustrated in FIG. 10B or FIG. 10C, and FIG. 10D and FIG. 10E respectively show the shape of the PSD incident light and the positional relation among the trunk region 24', the branch regions 26', and the PSD incident light IL without occurrence of the spot chipping.

Figure 11A:
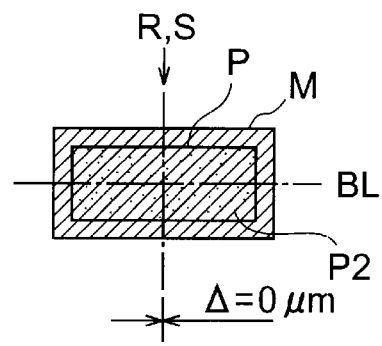
FIGS. 11A, 11B, 11C, and 11D are diagrams to show measurement results.
Figure 11B:
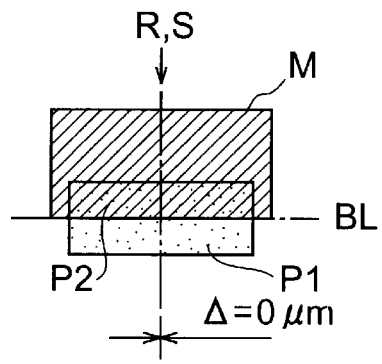
Figure 11C:
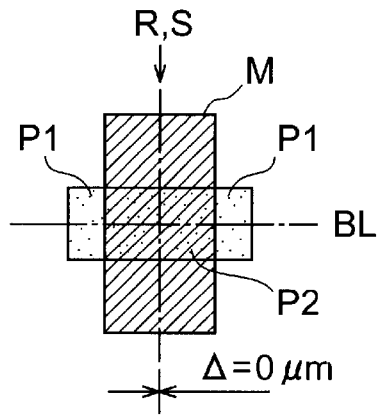
Figure 11D:
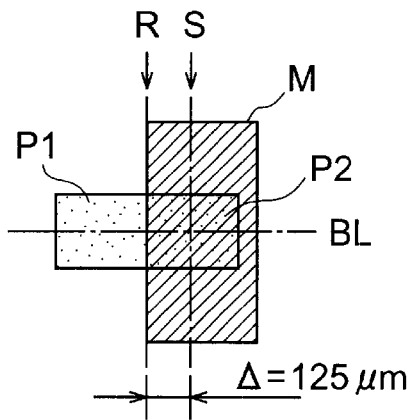

As illustrated in FIG. 11A, the position detection error is, of course, 0 without occurrence of the spot chipping. As illustrated in FIG. 11B, when the spot chipping appears asymmetric in the vertical direction, the spot chipping does not affect the position detection in the base line direction and the position detection error is 0. As illustrated in FIG. 11C, when the spot chipping appears symmetric left and right, the spot chipping does not affect the position detection in the base line direction, either, and the position detection error is 0. In contrast with it, when the spot chipping appears asymmetric in the horizontal direction as illustrated in FIG. 11D, no carriers flow into the branch regions corresponding to the part of the spot chipping and the number of branch regions 26 with flow of carriers is extremely reduced in comparison with the case without the spot chipping. As a result, there appears deviation of the position of the center of gravity and a large position detection error is made (125 μm in the case of FIG. 11D). Here the detection error of 125 μm in the PSD amounts to 12.5% where the length C of the trunk region of the PSD is equal to 1000 μm.

Figure 12A:
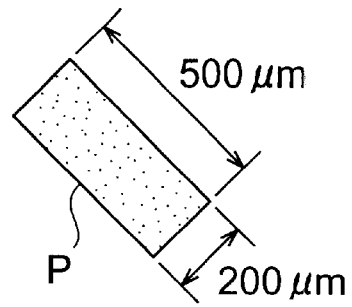
FIGS. 12A, 12B, 12C, 12D, and 12E are diagrams to show measurement conditions.
Figure 12B:
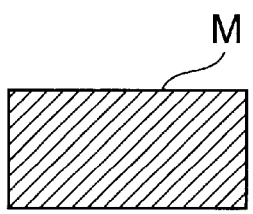
Figure 12C:
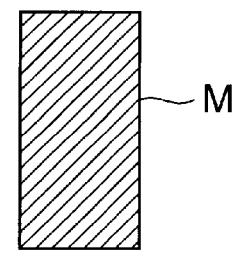
Figure 12D:
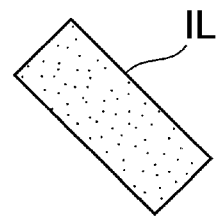
Figure 12E:
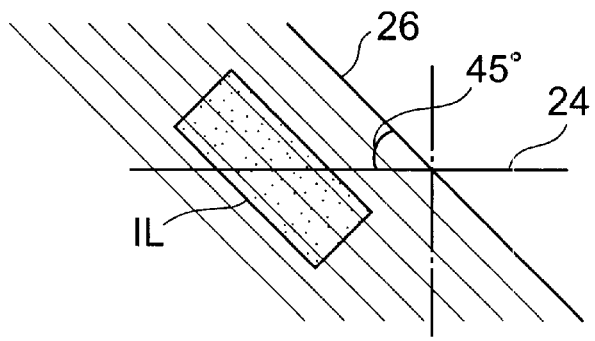

Next described is how the distance is measured in the distance measuring apparatus 10 according to the present embodiment. The distance measuring apparatus 10 according to the present embodiment uses as a position detector the PSD 14 in which the trunk region 24 extending in the base line direction and the branch regions 26 intersecting therewith at the angle of 45° are formed in the photosensitve surface. The LED light from the LED 12 is the slit light P having the cross section of 500 μm×200 μm as illustrated in FIG. 12A, and the LED 12 is located so that the slit light extends in the direction of 45° relative to the base line direction, as illustrated in FIG. 12D and FIG. 12E, upon reflection at the measured object M and upon incidence to the PSD 14. The measured object M is considered to be the one of the horizontally long or vertically long rectangle as illustrated in FIG. 12B or 12C. Since the trunk region 24 and the branch regions 26 intersect at the angle of 45° on the photosensitve surface of the PSD 14, the positional relation among the trunk region 24, the branch regions 26, and the PSD incident light is as illustrated in FIG. 12E.

Figure 13A:
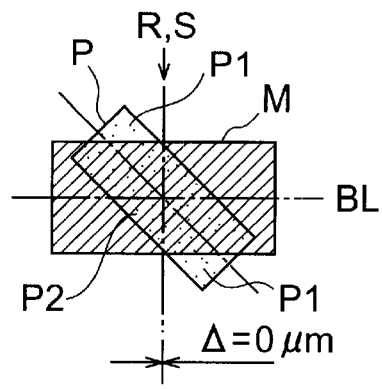
FIGS. 13A, 13B, 13C, and 13D are diagrams to show measurement results.
Figure 13B:
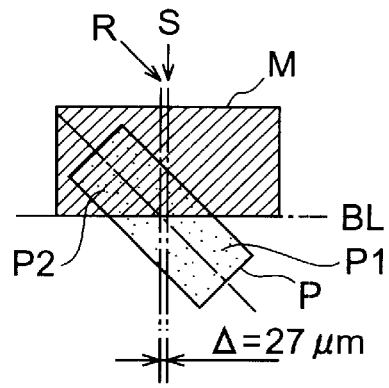
Figure 13C:
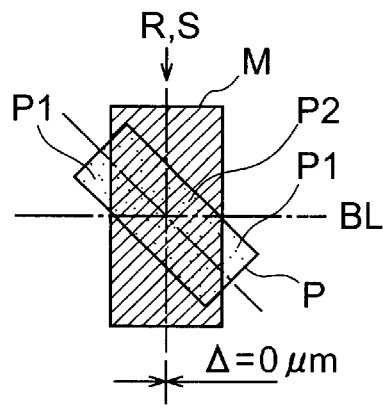
Figure 13D:
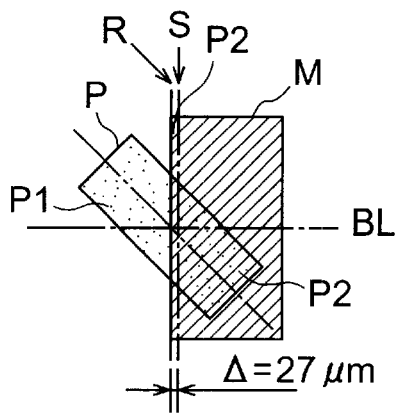

When the spot chipping appears symmetric up and down as illustrated in FIG. 13A or when the spot chipping appears symmetric left and right as illustrated in FIG. 13C, the spot chipping does not affect the position detection in the base line direction and the position detection error is 0. In contrast with it, when the spot chipping appears asymmetric in the vertical direction as illustrated in FIG. 13B or when the spot chipping appears asymmetric in the horizontal direction as illustrated in FIG. 13D, the position detection error is made. However, since the branch regions 26 make the angle of 45° to the base line direction, the number of branch regions 26 accepting flow of carriers with occurrence of spot chipping is not reduced when compared with the case without occurrence of spot chipping. As a result, the position detection error is also very small, 27 μm. Here the position detection error of 27 μm in the PSD 14 amounts to 2.7% where the length C of the trunk region 24 of the PSD 14 is equal to 1000 μm.

Next described is the effect of the distance measuring apparatus according to the present embodiment. Since in the distance measuring apparatus 10 according to the present embodiment the branch regions 26 make the angle of 45° to the base line direction, the number of branch regions 26 with flow of carriers does not decrease greatly with occurrence of the spot chipping when compared with the case without the spot chipping. Accordingly, the position detection error is extremely small in the PSD 14, so that the distance measurement error is extremely small. Since the apparatus can be constructed without use of special LED, PSD, etc., it can be made at very low cost and in compact shape. Particularly, when the branch regions 26 make the angle of 45° to the base line direction herein, the output can be attained at equivalent levels in either arrangement where the base line direction is set along the horizontal direction or along the vertical direction.

Since the distance measuring apparatus 10 according to the present embodiment is so arranged that the LED 12 projects the slit light and that the longitudinal direction of the cross section of the slit light incident to the photosensitve surface of the PSD 14 is parallel to the extending direction of the branch regions 26 of the PSD 14, the overlapping area can be made large between the slit light and each branch region and the PSD 14 can detect the incident light more efficiently. Accordingly, sufficient output can be attained even if the length is shortened in the direction of the width of the slit light; therefore, the distance measurement error can be smaller even with the spot chipping.

The distance measuring apparatus according to the above embodiment employed the LED 12 projecting the slit light, but the LED may also be either of devices projecting spot light of another shape such as a square, a circle, or the like, without having to be limited to the slit light. The distance measurement error due to the spot chipping can also be sufficiently small even in such cases using the spot light of the other shapes.

For the PSD used in the distance measuring apparatus 10 according to the above embodiment, a variety of modifications are conceivable as to the shapes of the trunk region 24 and the branch regions 26 and others. The PSDs according to the respective modifications will be described hereinafter.

Figure 14:
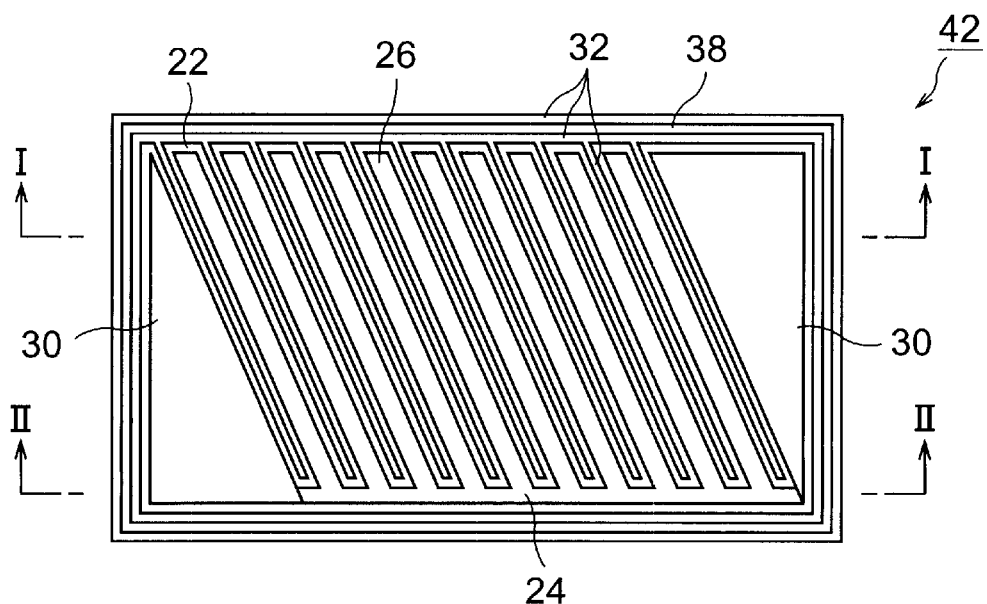
FIG. 14 is a plan view of another PSD.
Figure 15:
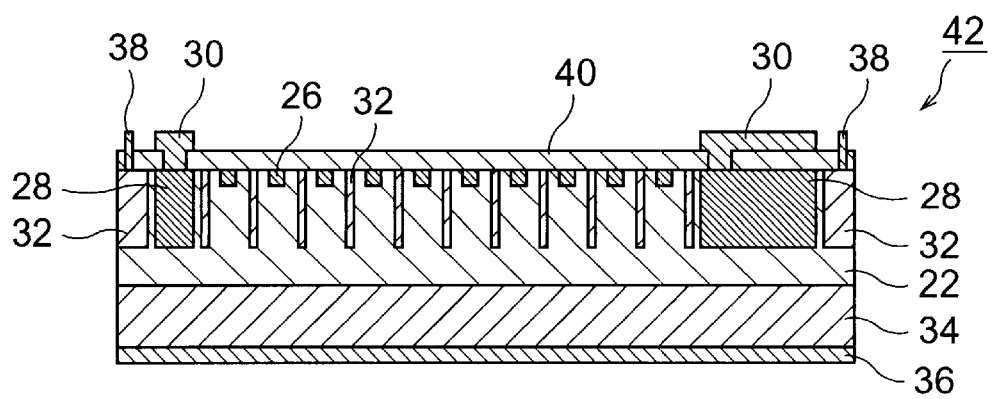
FIG. 15 is a cross-sectional view along line I—I of FIG. 14.
Figure 16:
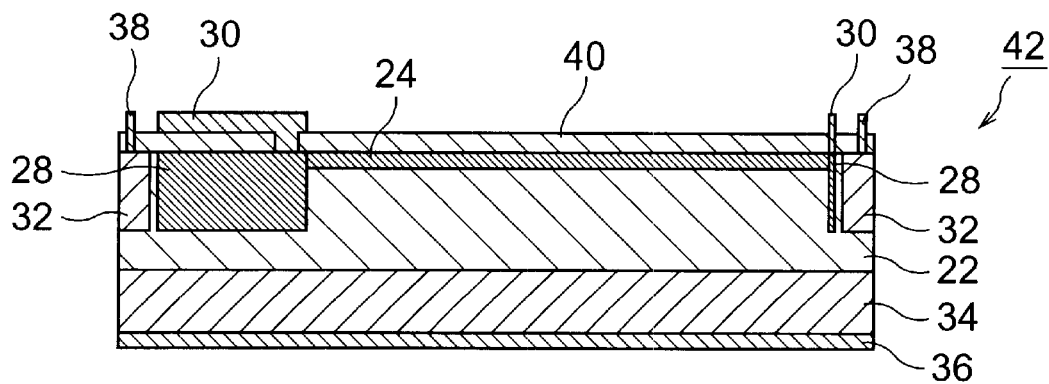
FIG. 16 is a cross-sectional view along line II—II of FIG. 14.

First described is the PSD according to the first modification. FIG. 14 is a plan view of the PSD 42 according to the present modification (from which the passivation film 40 is omitted), FIG. 15 a cross-sectional view along line I—I of FIG. 14, and FIG. 16 a cross-sectional view along line II—II of FIG. 14. The PSD 42 of the present modification is different from the PSD 14 of the above embodiment in that in the PSD 14 of the above embodiment the trunk region 24 is formed approximately in the central part in the short-side direction of the rectangle and the almost central part of each branch region 26 is electrically connected to the trunk region 24, whereas in the PSD 42 of the present modification the trunk region 24 is formed at an end in the short-side direction of the rectangle, i.e., adjacent to one longer side thereof and an end of each branch region 26 is electrically connected to the trunk region 24. This structure of the PSD 42 also permits an inexpensive and compact distance measuring apparatus to be constructed with a reduced distance measurement error. The position of the trunk region 24 relative to the branch regions 26 can be set at an arbitrary position, without having to be limited to the central part and the end part as described above.

Figure 17:
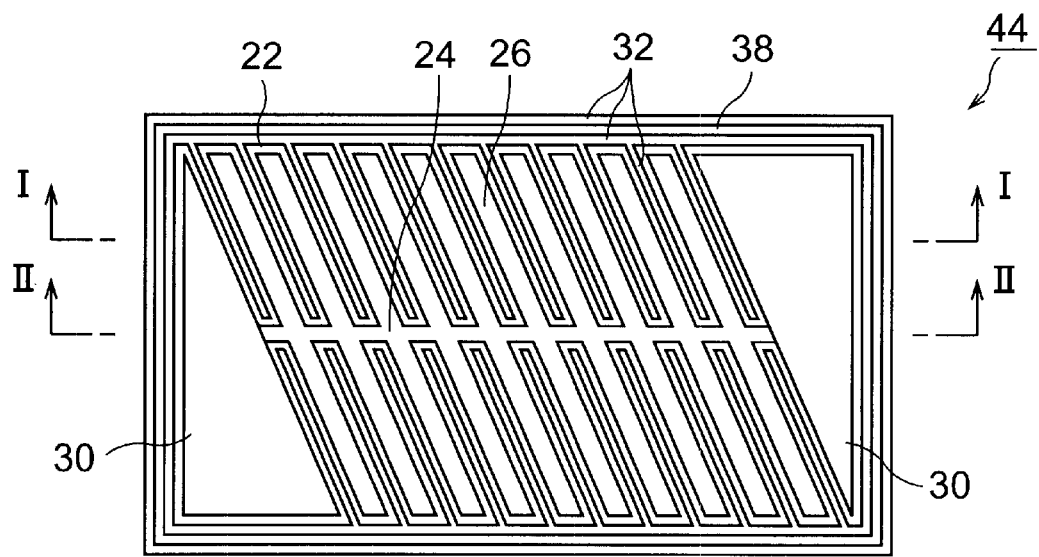
FIG. 17 is a plan view of another PSD.
Figure 18:
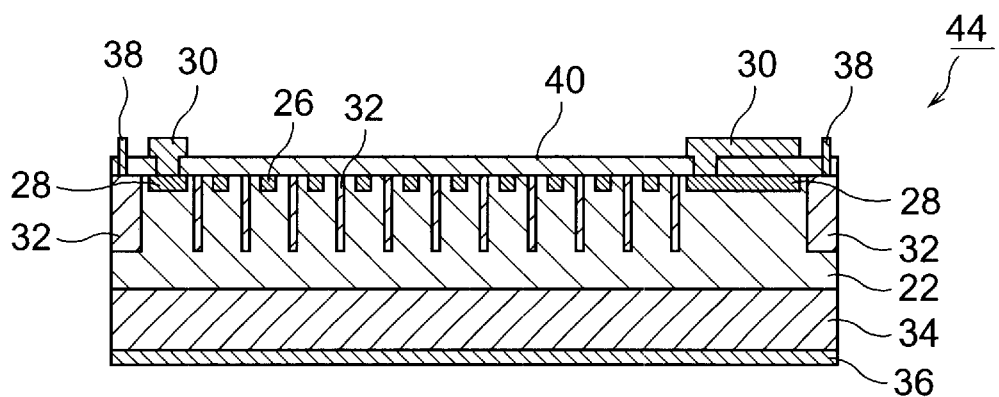
FIG. 18 is a cross-sectional view along line I—I of FIG. 17.
Figure 19:
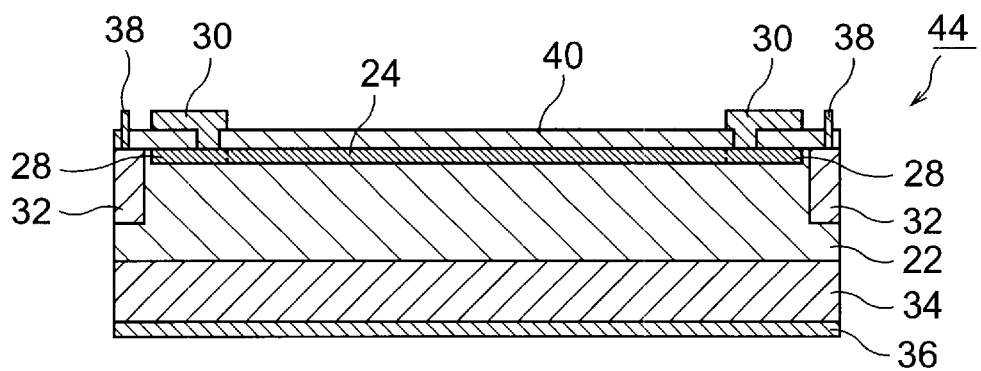
FIG. 19 is a cross-sectional view along line II—II of FIG. 17.

Next described is the PSD according to the second modification. FIG. 17 is a plan view of the PSD 44 according to the present modification (from which the passivation film 40 is omitted), FIG. 18 a cross-sectional view along line I—I of FIG. 17, and FIG. 19 a cross-sectional view along line II—II of FIG. 17. The PSD 44 of the present modification is different from the PSD 14 of the above embodiment in that in the PSD 14 of the above embodiment the pair of high-concentration regions 28 are formed at the two ends of the trunk region 24 and down to the position deeper than the trunk region 24, whereas in the PSD 44 of the present modification the high-concentration regions 28 are formed down to the depth approximately equal to that of the trunk region 24 at the same time as the formation of the trunk region 24. Since the sufficient condition is that the high-concentration regions 28 have the impurity concentration enough to realize the ohmic contact with the signal extracting electrodes 30, the simultaneous formation thereof together with the trunk region 24 simplifies the production steps and permits the PSD 44 to be fabricated at low cost. This structure of the PSD 44 also permits an inexpensive and compact distance measuring apparatus to be constructed with a reduced distance measurement error. The formation of the high-concentration regions 28 to the depth approximately equal to that of the trunk region 24 at the same time as the formation of the trunk region 24 as in the present modification can also be applied to the other modifications.

Figure 20:
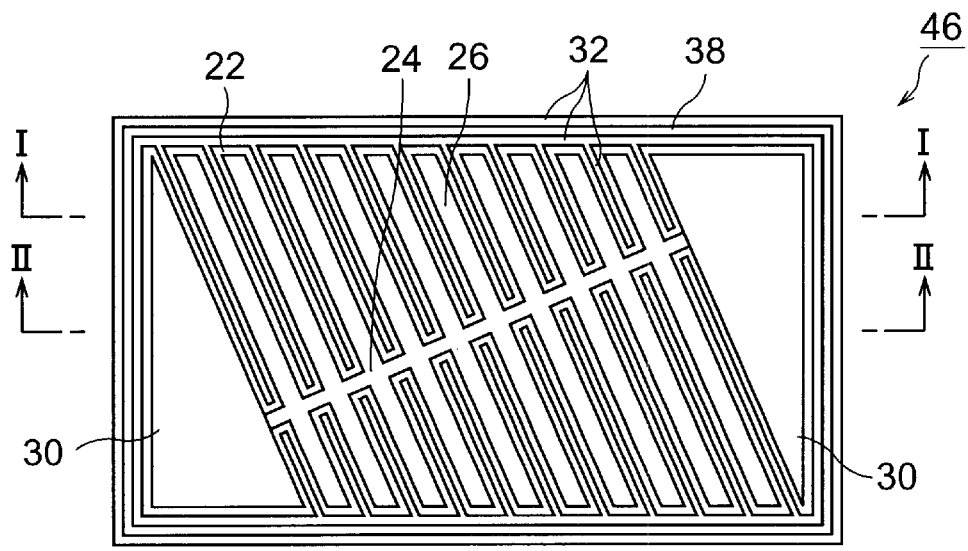
FIG. 20 is a plan view of another PSD.
Figure 21:
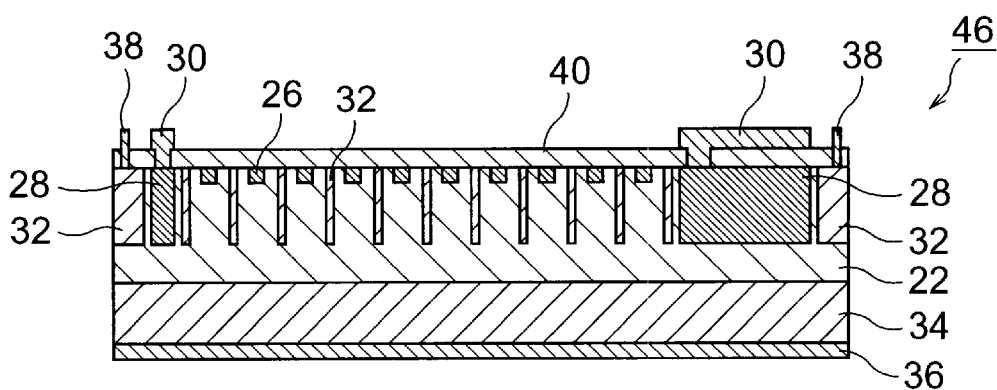
FIG. 21 is a cross-sectional view along line I—I of FIG. 20.
Figure 22:
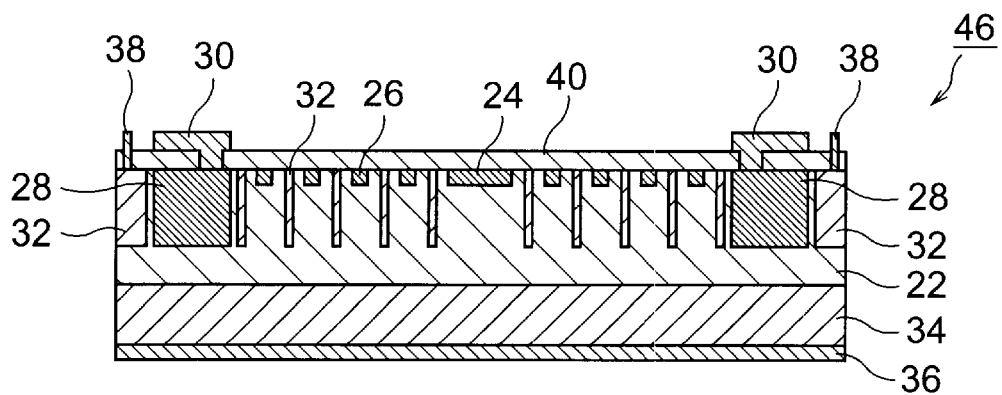
FIG. 22 is a cross-sectional view along line II—II of FIG. 20.

Next described is the PSD according to the third modification. FIG. 20 is a plan view of the PSD 46 according to the present modification (from which the passivation film 40 is omitted), FIG. 21 a cross-sectional view along line I—I of FIG. 20, and FIG. 22 a cross-sectional view along line II—II of FIG. 20. The PSD 46 of the present modification is different from the PSD 14 of the above embodiment in that in the PSD 14 of the above embodiment the trunk region 24 is formed so as to extend in the long-side direction, i.e., in the base line direction, whereas in the PSD 46 of the present modification the trunk region 24 is formed at a certain angle (acute angle) relative to the base line direction. The branch regions 26 are formed at the angle of 45° relative to the base line direction, as in the case of the PSD 14 of the above embodiment. The trunk region 26 can be made at an arbitrary angle to the base line direction and this structure of the PSD 46 also permits an inexpensive and compact distance measuring apparatus to be constructed with a reduced distance measurement error.

Figure 23:
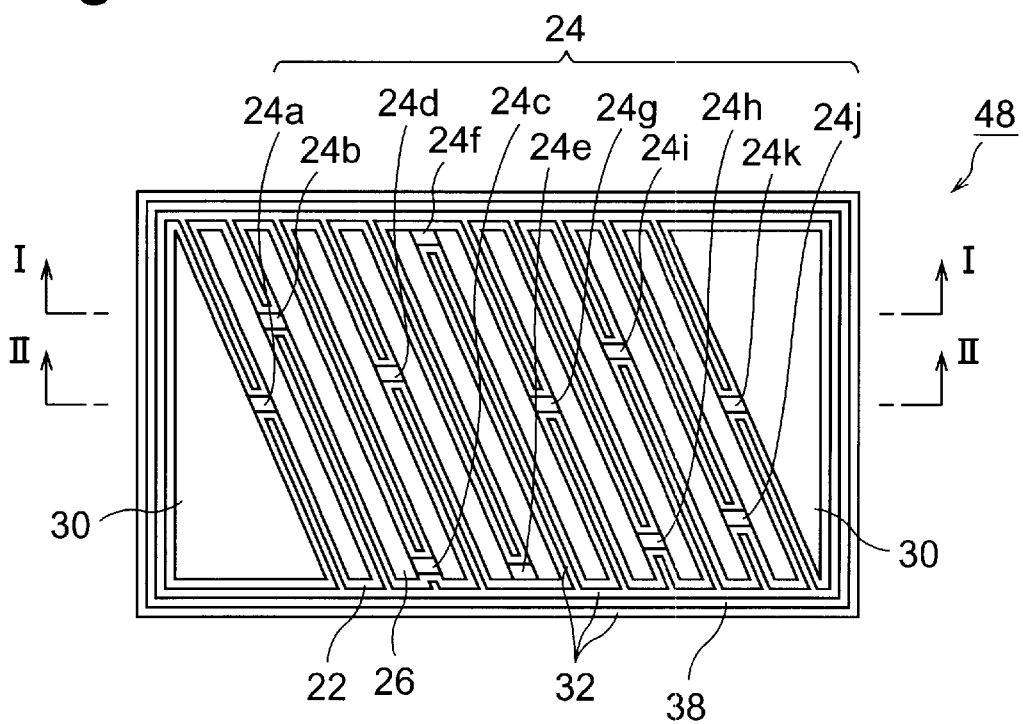
FIG. 23 is a plan view of another PSD.
Figure 24:
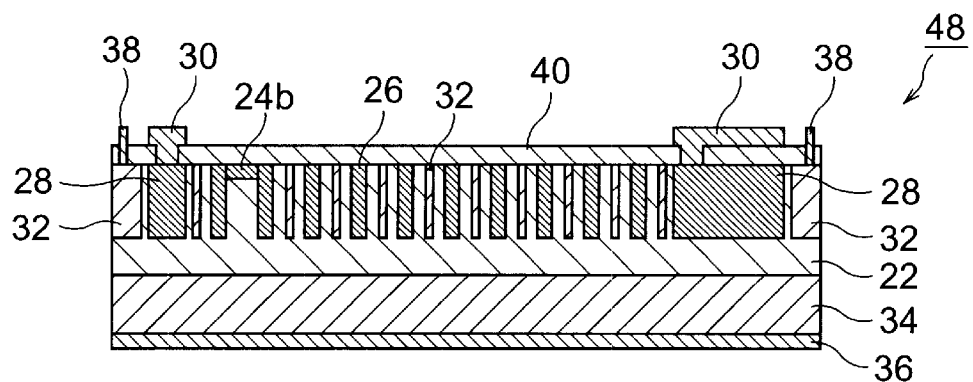
FIG. 24 is a cross-sectional view along line I—I of FIG. 23.
Figure 25:
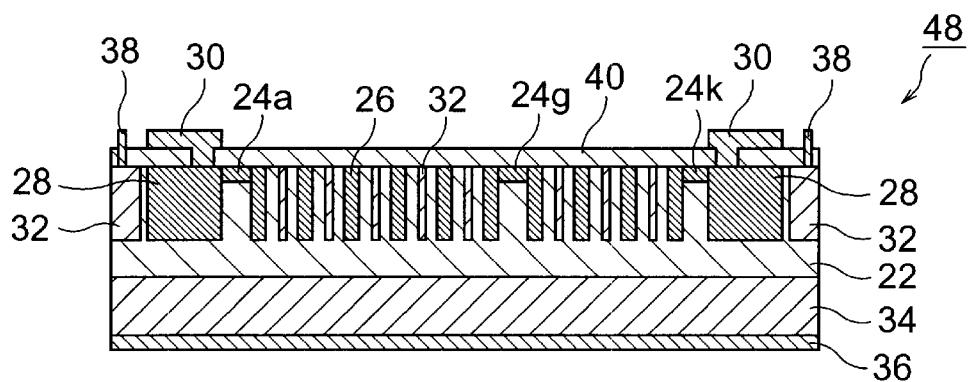
FIG. 25 is a cross-sectional view along line II—II of FIG. 23.

Next described is the PSD according to the fourth modification. FIG. 23 is a plan view of the PSD 48 according to the present modification (from which the passivation film 40 is omitted), FIG. 24 a cross-sectional view along line I—I of FIG. 23, and FIG. 25 a cross-sectional view along line II—II of FIG. 23. The PSD 48 of the present modification is different from the PSD 14 of the above embodiment in that in the PSD 14 of the above embodiment the trunk region 24 continuously extends between the pair of signal extracting electrodes 30, whereas in the PSD 48 of the present modification the trunk region 24 is split into a plurality of conductive regions 24*a* to 24*k* and each conductive region 24*a* to 24*k* electrically connects the adjacent branch regions 26. The two ends of the trunk region 24, i.e., the conductive regions 24*a*, 24*k* at the both ends are connected through the high-concentration regions 28 to the signal extracting electrodes 30. In the PSD 48 of the present modification, carriers generated in the branch regions 26 propagate both in the trunk region 24 and in the other branch regions 26 to be extracted as electric currents from the signal extracting electrodes 30. However, since the resistance per unit length of the branch regions 26 is extremely smaller than that of the trunk region 24, the resistance between the two signal extracting electrodes 30 is substantially dominated by the resistance of the trunk region 24. Accordingly, carriers generated with incidence of light are resistance-divided by the resistance of the trunk region 24 so as to be inversely proportional to the distances from the incidence position of the light to the two ends of the conductive regions 24*a*, 24*k*, to be outputted from the respective signal extracting electrodes 30, and thus the incident position of light can be detected based thereon. This structure of the PSD 48 also permits an inexpensive and compact distance measuring apparatus to be constructed with a reduced distance measurement error.

Figure 26:
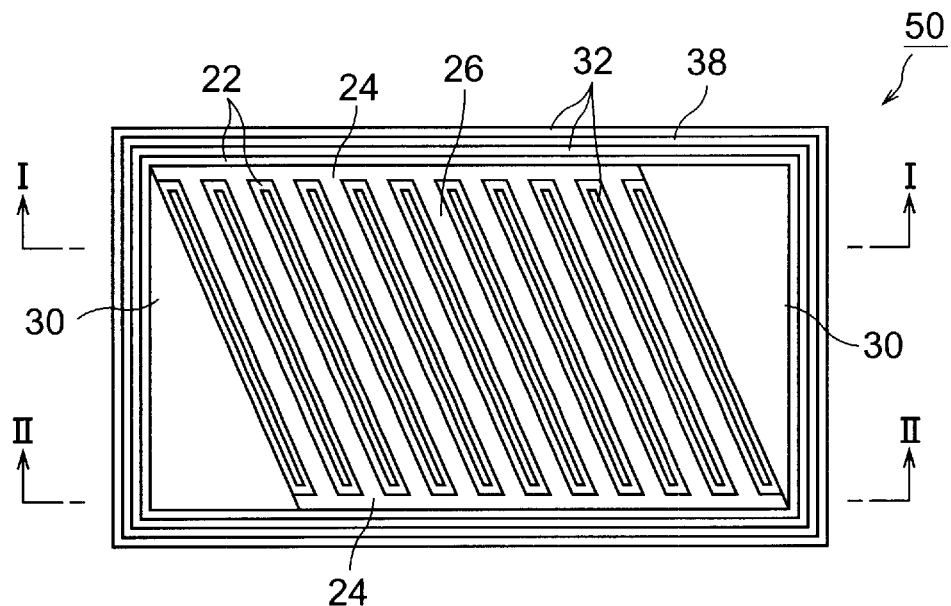
FIG. 26 is a plan view of another PSD.
Figure 27:
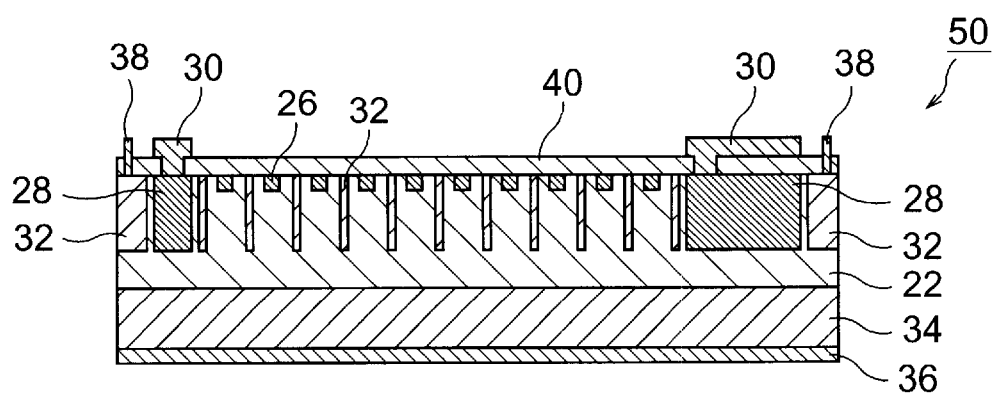
FIG. 27 is a cross-sectional view along line I—I of FIG. 26.
Figure 28:
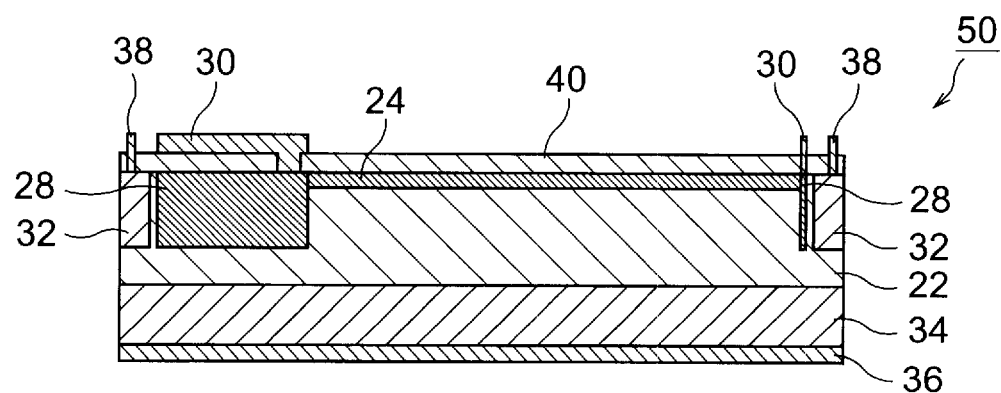
FIG. 28 is a cross-sectional view along line II—II of FIG. 26.

Next described is the PSD according to the fifth modification. FIG. 26 is a plan view of the PSD 50 according to the present modification (from which the passivation film 40 is omitted), FIG. 27 a cross-sectional view along line I—I of FIG. 26, and FIG. 28 a cross-sectional view along line II—II of FIG. 26. The PSD 50 of the present modification is different from the PSD 14 of the above embodiment in that in the PSD 14 of the above embodiment the trunk region 24 is formed approximately in the central part in the short-side direction of the rectangle and the almost central part of each branch region 26 is connected to the trunk region 24, whereas in the PSD 50 of the present modification two trunk regions 24 are formed at the both ends in the short-side direction of the rectangle, i.e., adjacent to the two long sides and the both ends of each branch region 26 are electrically connected to the two trunk regions 24, respectively. This structure of the PSD 50 also permits an inexpensive and compact distance measuring apparatus to be constructed with a reduced distance measurement error.

Figure 29:
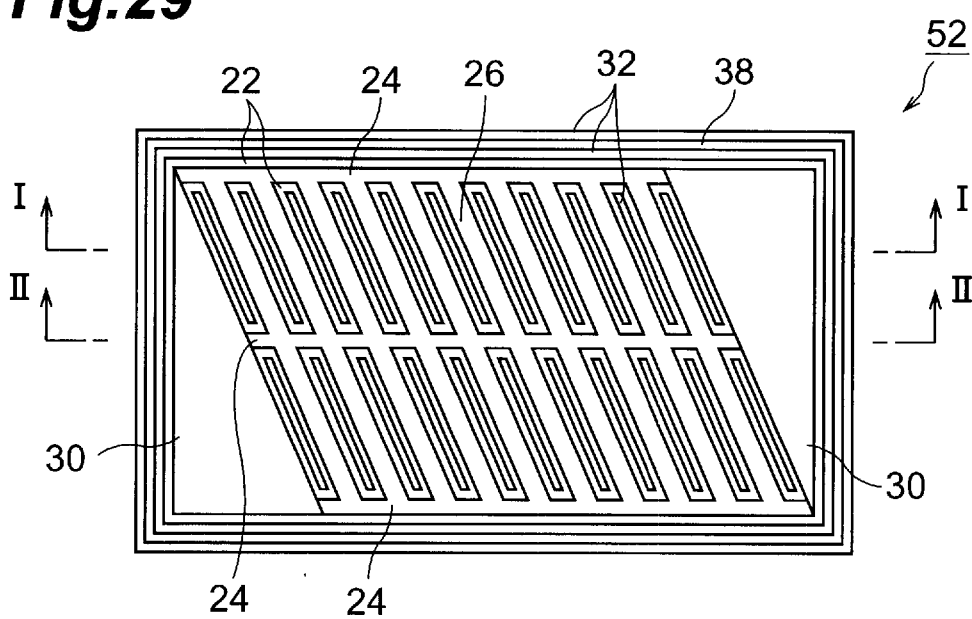
FIG. 29 is a plan view of another PSD.
Figure 30:
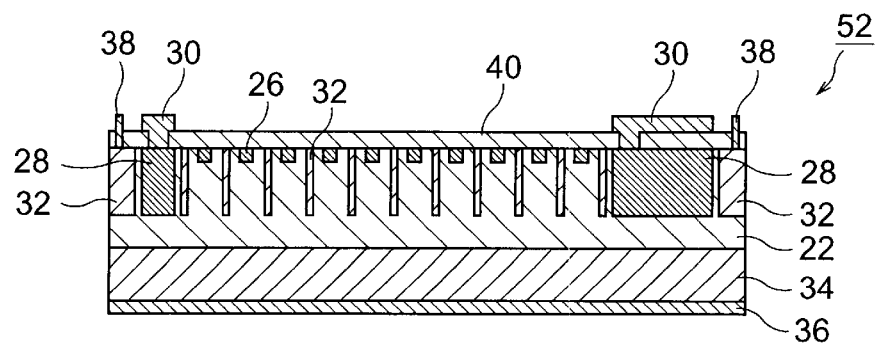
FIG. 30 is a cross-sectional view along line I—I of FIG. 29.
Figure 31:
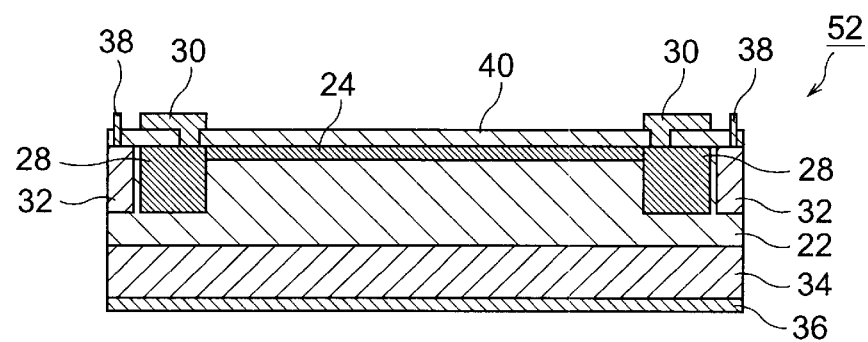
FIG. 31 is a cross-sectional view along line II—II of FIG. 29.

Next described is the PSD according to the sixth modification. FIG. 29 is a plan view of the PSD 52 according to the present modification (from which the passivation film 40 is omitted), FIG. 30 a cross-sectional view along line I—I of FIG. 29, and FIG. 31 a cross-sectional view along line II—II of FIG. 29. The PSD 52 of the present modification is different from the PSD 14 of the above embodiment in that in the PSD 14 of the above embodiment the trunk region 24 is formed approximately in the central part in the short-side direction of the rectangle and the almost central part of each branch region 26 is electrically connected to the trunk region 24, whereas in the PSD 52 of the present modification three trunk regions 24 are formed in the central part and at the both ends in the short-side direction of the rectangle and the central part and the both ends of each branch region 26 are electrically connected to the three trunk regions 24, respectively. This structure of the PSD 52 also permits an inexpensive and compact distance measuring apparatus to be constructed with a reduced distance measurement error.

Figure 32:
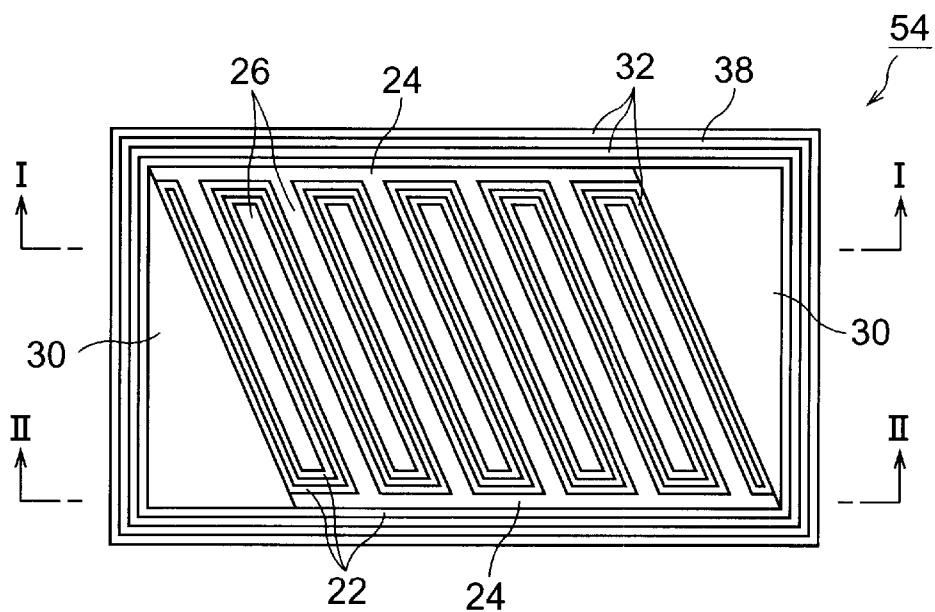
FIG. 32 is a plan view of another PSD.
Figure 33:
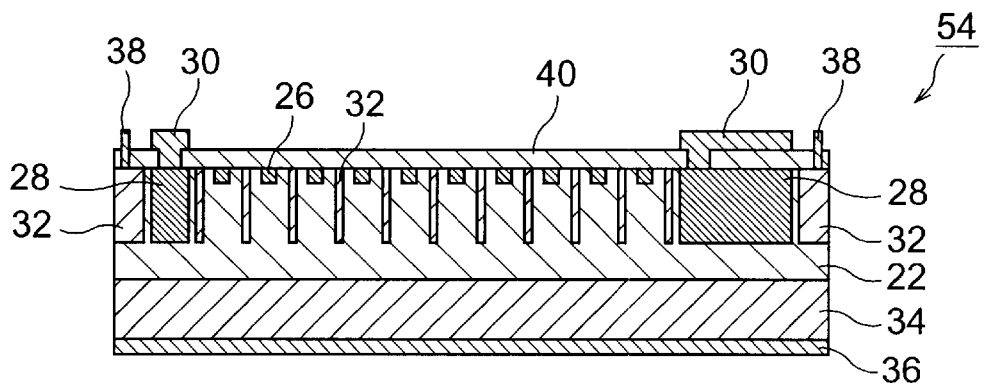
FIG. 33 is a cross-sectional view along line I—I of FIG. 32.
Figure 34:
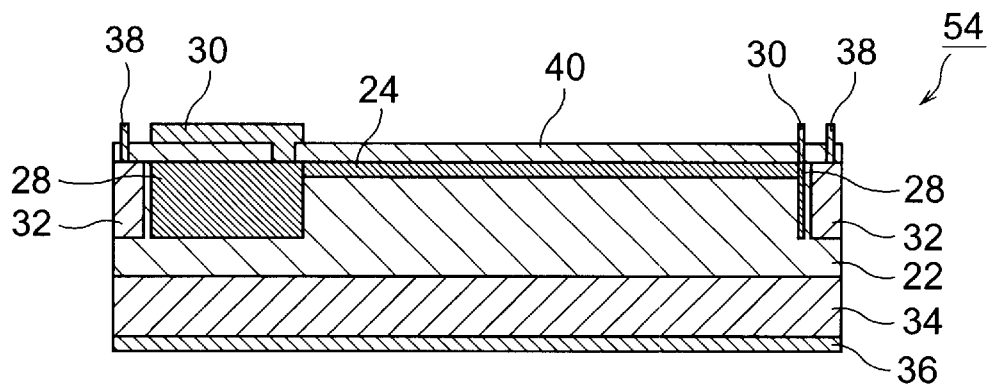
FIG. 34 is a cross-sectional view along line II—II of FIG. 32.

Next described is the PSD according to the seventh modification. FIG. 32 is a plan view of the PSD 54 according to the present modification (from which the passivation film 40 is omitted), FIG. 33 a cross-sectional view along line I—I of FIG. 32, and FIG. 34 a cross-sectional view along line II—II of FIG. 32. The PSD 54 of the present modification is different from the PSD 14 of the above embodiment in that in the PSD 14 of the above embodiment the trunk region 24 is formed approximately in the central part in the short-side direction of the rectangle and the almost central part of each branch region 26 is electrically connected to the trunk region 24, whereas in the PSD 54 of the present modification two trunk regions 24 are formed at the two ends in the short-side direction of the rectangle, i.e., adjacent to the two long sides and either ends of the branch regions 26 arranged in the base line direction are electrically connected alternately to one of the trunk regions 24. This structure of the PSD 54 also permits an inexpensive and compact distance measuring apparatus to be constructed with a reduced distance measurement error.

Figure 35:
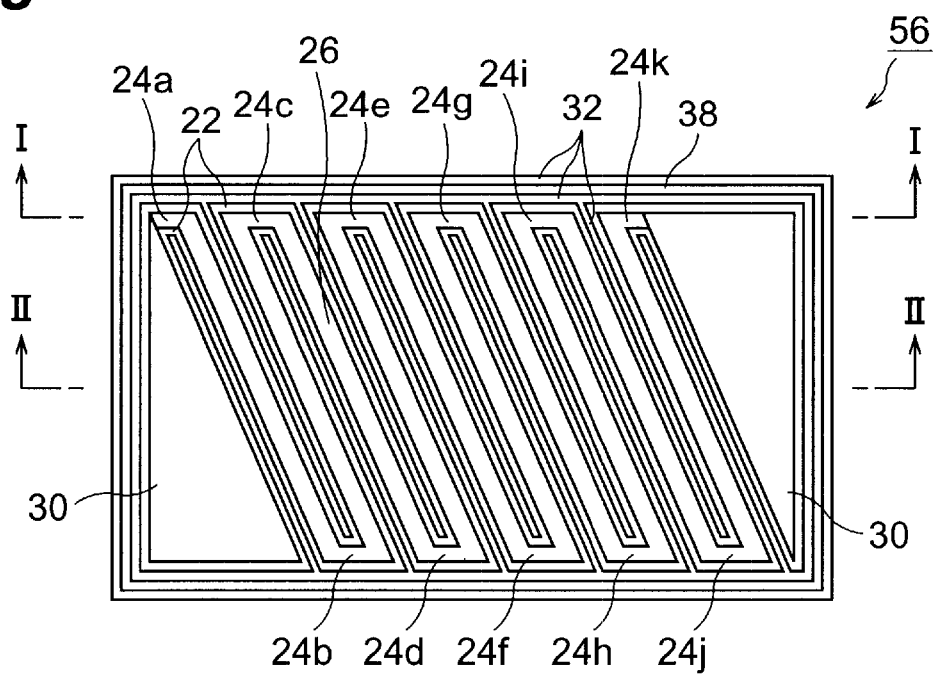
FIG. 35 is a plan view of another PSD.
Figure 36:
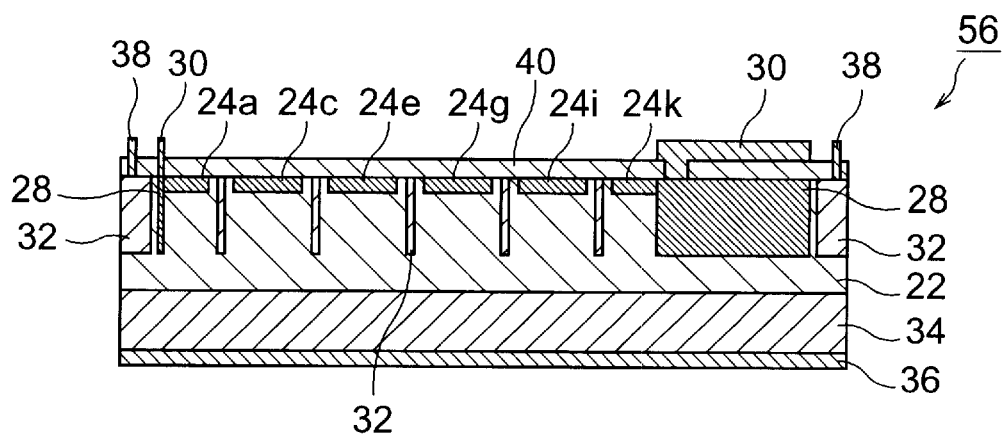
FIG. 36 is a cross-sectional view along line I—I of FIG. 35.
Figure 37:
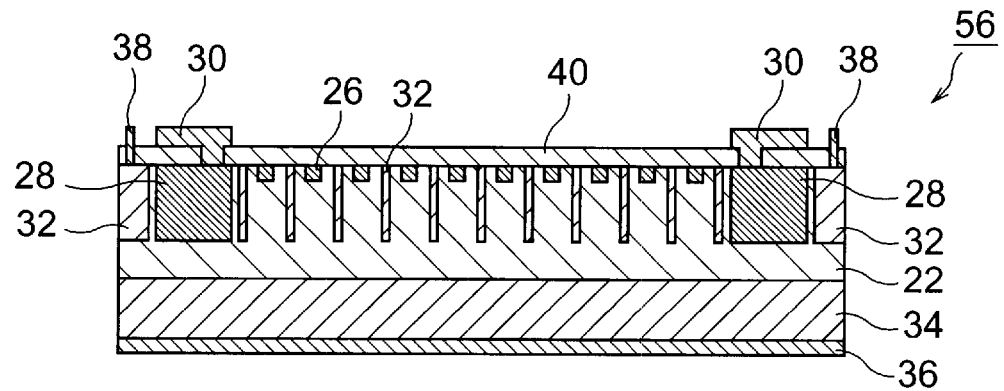
FIG. 37 is a cross-sectional view along line II—II of FIG. 35.

Next described is the PSD according to the eighth modification. FIG. 35 is a plan view of the PSD 56 according to the present modification (from which the passivation film 40 is omitted), FIG. 36 a cross-sectional view along line I—I of FIG. 35, and FIG. 37 a cross-sectional view along line II—II of FIG. 35. The PSD 56 of the present modification is a variation of the PSD 48 of the fourth modification described above, in which among the plurality of conductive regions 24*a* to 24*k* composing the trunk region 24 of the PSD 48, the conductive regions 24*a*, 24*c*, 24*e*, 24*g*, 24*i*, and 24*k* are provided on one end side in the short-side direction of the rectangle while the conductive regions 24*b*, 24*d*, 24*f*, 24*h*, and 24*j* are provided on the other end side in the short-side direction of the rectangle. This structure of the PSD 56 also permits an inexpensive and compact distance measuring apparatus to be constructed with a reduced distance measurement error.

Figure 38:
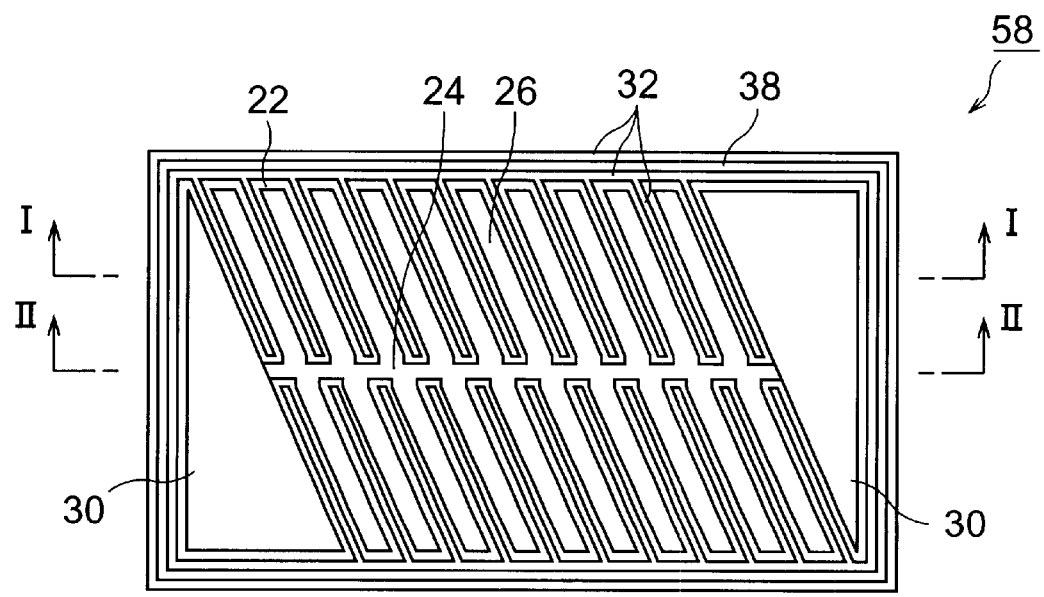
FIG. 38 is a plan view of another PSD.

Next described is the PSD according to the ninth modification. FIG. 38 is a plan view of the PSD 58 according to the present modification (from which the passivation film 40 is omitted). A cross section along line I—I of FIG. 38 is the same as FIG. 4 and a cross section along line II—II of FIG. 38 is the same as FIG. 5. The PSD 58 of the present modification is different from the PSD 14 of the above embodiment in that in the PSD 14 of the above embodiment each branch region 26 extends at the angle of 45° from the trunk region 24, whereas in the PSD 58 of the present modification each branch region 26 extends at the angle of 45° relative to the trunk region 24 extending in the base line direction while each branch region 26 is connected to the trunk region 24 at a different angle in the root part, i.e., near the trunk region 24. This structure of the PSD 58 also permits an inexpensive and compact distance measuring apparatus to be constructed with a reduced distance measurement error. To connect the branch regions 26 to the trunk region 24 at the different angle near it as in the present modification can also be applied to the other modifications.

In the position sensitive detectors according to the above embodiment or the modifications, the angle between the base line direction and the extending direction of the branch regions 26 was 45°, but it can be an arbitrary angle as long as it is an acute angle. When the angle between the base line direction and the extending direction of the branch regions 26 is not more than 85°, it becomes feasible to effectively prevent the decrease in the number of branch regions 26 into which carriers flow, even with occurrence of the spot chipping. When the angle between the base line direction and the extending direction of the branch regions 26 is not less than 30°, the PSD 14 can be downsized.

As described above, the above position sensitive detectors are the position sensitive detectors in which the electric currents outputted from the pair of respective electrodes 30 provided at the both ends of the trunk region 24 vary according to the incidence position of light in the predetermined base line direction BL on the photosensitve surface, wherein the plurality of branch regions 26 are arranged in the base line direction BL and each of them is electrically connected to the trunk region 24 and wherein the angle between the base line direction BL and the extending direction of the branch regions 26 is an acute angle.

When the extending direction of the branch regions 26 is perpendicular to the base line direction BL and when spot chipping occurs, no carriers flow into the branch regions corresponding to the part of the spot chipping and the number of branch regions into which carriers flow is extremely reduced when compared with that without occurrence of spot chipping. As a consequence, there occurs deviation of the center of gravity and the position detection error becomes large. In contrast with it, when the extending direction of the branch regions 26 makes the acute angle to the base line direction BL as in the case of the above position sensitive detectors, the number of branch regions into which carriers flow with occurrence of spot chipping is resistant to decrease as compared with the case without occurrence of the spot chipping. Therefore, the deviation of the center of gravity is small and the position detection error is also small.

Since the extending direction of the branch regions 26 makes the acute angle to the base line direction BL, the above position sensitive detectors resist decreasing the number of branch regions into which carriers flow with occurrence of the spot chipping, as compared with the case without occurrence of the spot chipping. As a consequence, the position detection error becomes extremely small. Since the apparatus does not have to be constructed using the triple light receiving elements or the like, it can be constructed at extremely low cost and in compact size.

In the above position sensitive detectors, the angle between the extending direction of the branch regions 26 and the base line direction BL is preferably not more than 85°.

When the angle between the extending direction of the branch regions and the base line direction is not more than 85°, it becomes feasible to effectively prevent the decrease in the number of branch regions into which carriers flow with occurrence of the spot chipping.

In the above position sensitive detectors, the angle between the extending direction of the branch regions and the base line direction is preferably not less than 30°.

When the angle between the extending direction of the branch regions 26 and the base line direction BL is not less than 30°, it becomes feasible to prevent the length of the position sensitive detector in the base line direction BL from becoming long and thus to downsize the position sensitive detector.

In the above position sensitive detectors, the angle between the extending direction of the branch regions 26 and the base line direction is more preferably approximately 45°.

When the angle between the extending direction of the branch regions 26 and the base line direction BL is approximately 45°, the output can be obtained at equivalent levels both in the case where the position sensitive detector (the base line direction thereof) is set along the horizontal direction and in the case it is set along the vertical direction.

In the above position sensitive detectors, the pair of electrodes each are of the approximately triangular shape.

When the electrodes are of the approximately triangular shape, the electrodes of the large area can be formed efficiently in the portions where the branch regions are not formed, which can prevent increase in the size of the position sensitive detector.

In the above position sensitive detectors, the trunk region 24 and branch regions 26 of the semiconductor of the second conduction type (n-type or (p-type)) are formed on the substrate of the semiconductor of the first conduction type (p-type or (n-type)).

In the above position sensitive detectors (for example, the one illustrated in FIG. 3), each of the branch regions 26 is electrically connected in the almost central part thereof to the trunk region 24.

In the above position sensitive detectors (for example, the one illustrated in FIG. 14), each of the branch regions 26 is electrically connected at the end thereof to the trunk region 24.

In the above position sensitive detectors, the trunk region 24 is formed so as to extend in the base line direction BL and in parallel thereto.

In the above position sensitive detectors (for example, the one illustrated in FIG. 20), the trunk region is formed so as to extend in the direction making the acute angle to the base line direction BL.

In the above position sensitive detectors (for example, the one illustrated in FIG. 26), the trunk region consists of a plurality of trunk regions.

In the above position sensitive detectors (for example, the one illustrated in FIG. 26), the trunk region consists of the two trunk regions and each of the branch regions is electrically connected at the both ends thereof to the two trunk regions.

In the above position sensitive detectors (for example, the one illustrated in FIG. 32), the trunk region consists of the two trunk regions and the branch regions are electrically connected at either end thereof to one of the two trunk regions.

In the above position sensitive detectors (for example, the one illustrated in FIG. 29), the trunk region consists of three trunk regions and each of the branch regions is electrically connected at the both ends and in the approximately central part to the three trunk regions, respectively.

In the above position sensitive detectors (for example, the one illustrated in FIG. 23), the structure can also be such that the trunk region 24 consists of a plurality of conductive regions and the plurality of conductive regions electrically connect the adjacent branch regions.

All the position sensitive detectors described above can be applied to the aforementioned distance measuring apparatus.

The distance measuring apparatus comprises the light source 12 for projecting the light toward the measured object; the position sensitive detector in which the photosensitve surface accept the light projected from the light source 12 and reflected by the measured object M and in which the electric currents outputted from the pair of respective electrodes 30, 30 provided at the both ends of the trunk region 24, vary according to the incidence position of the light in the base line direction BL on the photosensitve surface; and the arithmetic means 16 for computing the distance to the measured object, based on the output of the position sensitive detector, wherein the position sensitive detector is either one of the above position sensitive detectors.

When the distance measuring apparatus is constructed using the position sensitive detector wherein the extending direction of the branch regions 26 is perpendicular to the base line direction BL, with occurrence of spot chipping, no carriers flow into the branch regions 26 corresponding to the part of the spot chipping at all and the number of branch regions into which carriers flow is extremely reduced when compared with that without occurrence of spot chipping. As a result, there occurs the deviation of the center of gravity and the position detection error becomes large. In contrast with it, when the apparatus is constructed using the position sensitive detector wherein the extending direction of the branch regions 26 makes the acute angle to the base line direction BL as in the present distance measuring apparatus, even with occurrence of spot chipping, the number of branch regions 26 into which carriers flow is hard to decrease as compared with the case without occurrence of spot chipping. Accordingly, the deviation of the center of gravity is small and the position detection error is also small.

In the above distance measuring apparatus, the light source 12 is the light source that projects the slit light and that is arranged so that the longitudinal direction of the cross section of the slit light incident to the photosensitve surface of the position sensitive detector is approximately parallel to the extending direction of the branch regions 26 in the position sensitive detector.

When the apparatus is arranged in such structure that the light source 12 projects the slit light and the longitudinal direction of the cross section of the slit light is approximately parallel to the extending direction of the branch regions 26, the overlapping area becomes large between the slit light and each branch region 26 and thus the light can be received more effectively. Accordingly, sufficient output can be attained even if the length of the slit light is decreased in the width direction; therefore, the position detection error becomes much smaller in the position sensitive detector and the distance measurement error due to the spot chipping also becomes much smaller.

As described above, each of the above position sensitive detectors is the position sensitive detector in which the electric currents outputted from the two ends of the trunk region 24 vary according to the light incidence position on the photosensitve surface comprising the plurality of branch regions 26 extending from the trunk region 24, wherein the branch regions 26 extend substantially obliquely relative to the position detection direction BL. When the detector is incorporated in the distance measuring apparatus, the position detection direction is coincident with the base line direction. Here the minimum of the angle between the extending direction of the branch regions 26 and the position detection direction is preferably not more than 85°, more preferably not less than 30°, and still more preferably approximately 45°. The term "approximately" herein means the variation of less than ±5%.

The pair of signal extracting electrodes 30 are preferably provided at the both ends of the trunk region and the pair of signal extracting electrodes 30 each are preferably of the nearly triangular shape. The nearly triangular shape herein embraces quadrangular and higher polygons resulting from chipping near an apex or apexes of a triangle within 5% of the length of the shortest side forming the triangle, and triangles with a projection or a depression of the size not more than 5% of the length of each side in part of each side.

Each of the branch regions 26 preferably has substantially equal width along the extending direction, the extending direction of each of the branch regions 26 is preferably constant in the photosensitve surface, and it is preferable that the luminous shape of the incident light IL into the position sensitive detector be of a rectangle (slit) and that the longitudinal direction of the rectangle be coincident with the extending direction of the branch regions 26. This incident light IL preferably has the size enough to simultaneously overlap with a plurality of branch regions. The luminous shape of the incident light into the position sensitive detector may also be a circle.

What is claimed is:

1. A position sensitive detector in which electric currents output from two ends of a resistive trunk region vary according to a light incidence position of a light spot on a photosensitive surface comprising a plurality of branch regions extending to and leading charges into the trunk region, wherein the branch regions extend substantially obliquely relative to the resistive trunk region for sensing the light incidence position along the resistive trunk region while preventing sensing error due to spot chipping of the light spot.

2. A position sensitive detector according to claim 1, wherein a minimum of an angle between an extending direction of the branch regions and the position detection direction is not more than 85°.

3. A position sensitive detector according to claim 1, wherein a minimum of an angle between an extending direction of the branch regions and the position detection direction is not less than 30°.

4. A position sensitive detector according to claim 1, wherein a minimum of an angle between an extending direction of the branch regions and the position detection direction is approximately 45°.

5. A position sensitive detector according to claim 1, wherein a pair of signal extracting electrodes are provided at the two ends of the trunk region and said pair of signal extracting electrodes each are of an approximate triangle shape.

6. A position sensitive detector according claim 1, wherein said trunk region and said branch regions of a semiconductor of a second conduction type are formed on a substrate of a semiconductor of a first conduction type.

7. A position sensitive detector according to claim 1, wherein each of said branch regions is electrically connected at an almost central part thereof to the trunk region.

8. A position sensitive detector according to claim 1, wherein each of said branch regions is electrically connected at an end thereof to the trunk region.

9. A position sensitive detector according to claim 1, wherein said trunk region extends in said position detection direction.

10. A position sensitive detector according to claim 1, wherein said trunk region extends obliquely relative to said position detection direction.

11. A position sensitive detector according to claim 1, wherein said trunk region comprises several split resistive regions, said split resistive regions being physically separated and electrically connected via said branch regions.

12. A position sensitive detector according to claim 11, wherein two portions of said split resistive regions are arranged at both ends of each of said branch regions.

13. A position sensitive detector according to claim 11, wherein one of said split resistive regions is arranged at one end of each of said branch regions.

14. A position sensitive detector according to claim 11, wherein one of said split resistive regions is arranged at three point on each of said branch regions.

15. A position sensitive detector according to claim 1, wherein said trunk region electrically connects said branch regions adjacent to each other.

16. A position sensitive detector according to claim 15, comprising a structure formed by a pair of said trunk regions and interspaced branch regions.

17. A position sensitive detector according to claim 1, wherein each of said branch regions has a substantially equal width along an extending direction thereof.

18. A position sensitive detector according to claim 1, wherein an extending direction of each of said branch regions is constant in the photosensitve surface.

19. A position sensitive detector according to claim 1, wherein a luminous shape of the incident light onto the position sensitive detector is a circle.

20. A position sensitive detector according to claim 1, wherein a luminous shape of the incident light onto the position sensitive detector is a rectangle and the longitudinal direction of the rectangle is coincident with an extending direction of said branch regions.

21. A position sensitive detector according to claim 19, wherein said incident light has a size enough to simultaneously overlap with a plurality of branch regions.

22. A distance measuring apparatus comprising a light source for projecting light toward a measured object; a position sensitive detector in which a photosensitive surface accepts the light projected from the light source and reflected by the measured object and in which electric currents output from a pair of respective electrodes provided at two ends of a trunk region vary according to an incidence position of the light in a predetermined base line direction on the photosensitive surface; and arithmetic means for computing a distance to the measured object, based on output of said position sensitive detector, wherein said position sensitive detector is the position sensitive detector as set forth in claim 1.

23. A distance measuring apparatus according to claim 22, wherein said light source is a light source for projecting slit light and the light source is arranged so that a longitudinal direction of a cross section of said slit light incident to said photosensitve surface of said position sensitive detector is approximately parallel to an extending direction of said branch regions of the position sensitive detector.

* * * * *